United States Patent
Jeong

(10) Patent No.: US 11,923,018 B2
(45) Date of Patent: Mar. 5, 2024

(54) SEMICONDUCTOR MEMORY DEVICE AND METHOD WITH MULTIPLE VERIFY VOLTAGES

(71) Applicant: SK hynix Inc., Icheon-si (KR)

(72) Inventor: Seung Geun Jeong, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 179 days.

(21) Appl. No.: 17/561,172

(22) Filed: Dec. 23, 2021

(65) Prior Publication Data

US 2023/0050399 A1 Feb. 16, 2023

(30) Foreign Application Priority Data

Aug. 13, 2021 (KR) .................. 10-2021-0107605

(51) Int. Cl.
*G11C 16/34* (2006.01)
*G11C 16/08* (2006.01)
*G11C 16/10* (2006.01)
*G11C 16/30* (2006.01)

(52) U.S. Cl.
CPC .......... *G11C 16/3459* (2013.01); *G11C 16/08* (2013.01); *G11C 16/102* (2013.01); *G11C 16/30* (2013.01)

(58) Field of Classification Search
CPC ... G11C 16/3459; G11C 16/08; G11C 16/102; G11C 16/30; G11C 16/0483; G11C 16/10; G11C 2211/5621; G11C 11/5628
See application file for complete search history.

(56) References Cited

U.S. PATENT DOCUMENTS

| 9,640,265 | B1* | 5/2017 | Honma | G11C 11/5628 |
| 2013/0033938 | A1* | 2/2013 | Park | G11C 16/0483 |
| | | | | 365/185.22 |
| 2019/0019559 | A1* | 1/2019 | Ueno | G11C 16/3459 |
| 2021/0090642 | A1* | 3/2021 | Nagao | G11C 16/3459 |

FOREIGN PATENT DOCUMENTS

| KR | 1020090011249 A | 2/2009 |
| KR | 1020180082830 A | 7/2018 |

* cited by examiner

*Primary Examiner* — Sultana Begum
(74) *Attorney, Agent, or Firm* — William Park & Associates Ltd.

(57) ABSTRACT

A semiconductor memory device includes a memory cell array, a peripheral circuit, and a control logic. The memory cell array includes a plurality of memory cells. The peripheral circuit performs a program operation on selected memory cells among the plurality of memory cells. The control logic controls the program operation of the peripheral circuit. The program operation includes a plurality of program loops. The control logic is configured to control the peripheral circuit to apply a program voltage to a select word line that is connected to the selected memory cells, apply a first under drive voltage that is determined based on at least one verify voltage to the select word line, and apply the at least one verify voltage to the select word line in each of the plurality of program loops. The first under drive voltage is at a lower voltage level than the at least one verify voltage.

22 Claims, 24 Drawing Sheets

SEMICONDUCTOR MEMORY DEVICE AND METHOD WITH MULTIPLE VERIFY VOLTAGES

CROSS-REFERENCE TO RELATED APPLICATION

The present application claims priority under 35 U.S.C. § 119(a) to Korean patent application number 10-2021-0107605 filed on Aug. 13, 2021, in the Korean Intellectual Property Office, the entire disclosure of which is incorporated by reference herein.

BACKGROUND

1. Technical Field

The present disclosure relates to an electronic device, and more particularly, to a semiconductor memory device and a method of operating the same.

2. Related Art

A semiconductor memory device may be formed in a two-dimensional structure in which strings are horizontally arranged on a semiconductor substrate, or in a three-dimensional structure in which the strings are vertically stacked on the semiconductor substrate. A three-dimensional memory device is a memory device designed to resolve a limit of an integration degree of a two-dimensional memory device, and may include a plurality of memory cells that are vertically stacked on a semiconductor substrate.

SUMMARY

According to an embodiment of the present disclosure, a semiconductor memory device includes a memory cell array, a peripheral circuit, and a control logic. The memory cell array includes a plurality of memory cells. The peripheral circuit performs a program operation on selected memory cells among the plurality of memory cells. The control logic controls the program operation of the peripheral circuit. The program operation includes a plurality of program loops. The control logic is configured to control the peripheral circuit to apply a program voltage to a select word line that is connected to the selected memory cells, apply a first under drive voltage that is determined based on at least one verify voltage to the select word line, and apply the at least one verify voltage to the select word line in each of the plurality of program loops. The first under drive voltage is at a lower voltage level than the at least one verify voltage.

According to another embodiment of the present disclosure, selected memory cells are programmed among a plurality of memory cells that are included in a memory cell array, by a method of operating a semiconductor memory device. The method includes a plurality of program loops. Each of the plurality of program loops includes determining operation voltages to be used in a current program loop, applying a program voltage to the selected memory cells by using the determined operation voltages, and performing a verify operation on the selected memory cells. The operation voltages include at least one verify voltage and a first under drive voltage that is at a lower voltage level than the verify voltage. In determining the operation voltages to be used in the current program loop, the first under drive voltage is determined based on the verify voltage.

DETAILED DESCRIPTION

Specific structural or functional descriptions of embodiments according to the concept which are disclosed in the present specification or application are illustrated only to describe the embodiments according to the concept of the present disclosure. The embodiments according to the concept of the present disclosure may be carried out in various forms and should not be construed as being limited to the embodiments described in the present specification or application.

An embodiment of the present disclosure provides a semiconductor memory device capable of improving a program speed and a method of operating the same.

The present technology may provide a semiconductor memory device capable of improving a program speed and a method of operating the same.

Figure 1:
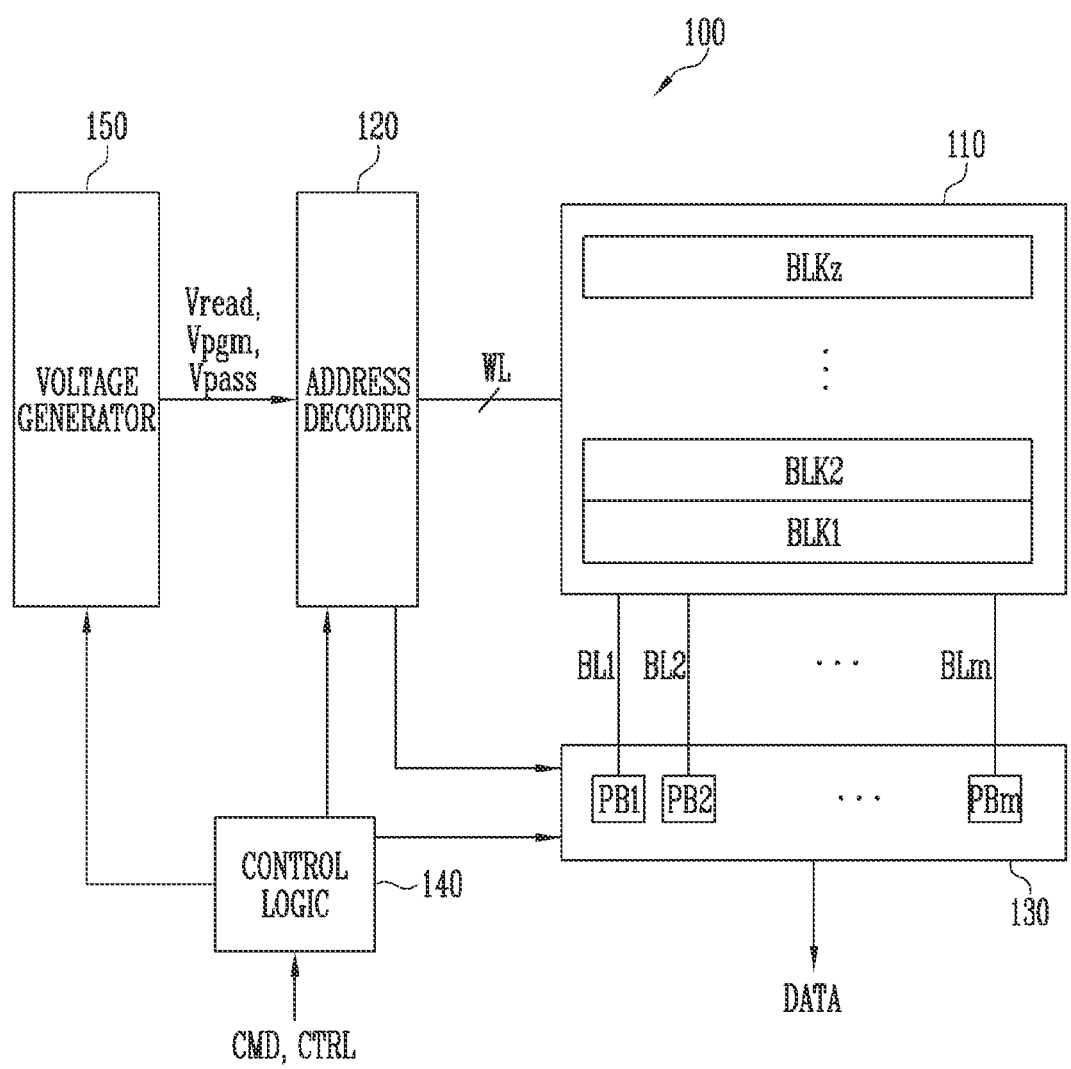
FIG. 1 is a block diagram illustrating a semiconductor memory device according to an embodiment of the present disclosure.

FIG. 1 is a block diagram illustrating a semiconductor memory device according to an embodiment of the present disclosure.

Referring to FIG. 1, the semiconductor memory device 100 may include a memory cell array 110, an address decoder 120, a read and write circuit 130, a control logic 140, and a voltage generator 150.

The memory cell array 110 may include a plurality of memory blocks BLK1 to BLKz. The plurality of memory blocks BLK1 to BLKz are connected to the address decoder 120 through word lines WL. The plurality of memory blocks BLK1 to BLKz are connected to the read and write circuit 130 through bit lines BL1 to BLm. Each of the plurality of memory blocks BLK1 to BLKz may include a plurality of memory cells. As an embodiment, the plurality of memory cells are non-volatile memory cells and may be configured of non-volatile memory cells with a vertical channel structure. The memory cell array 110 may be configured as a memory cell array of a two-dimensional structure. According to an embodiment, the memory cell array 110 may be configured as a memory cell array of a three-dimensional structure. According to an embodiment of the present disclosure, each of the plurality of memory blocks BLK1 to BLKz, included in the memory cell array 110, may include a plurality of sub-blocks. For example, each of the plurality of memory blocks BLK1 to BLKz may include two sub-blocks. In another example, each of the plurality of memory blocks BLK1 to BLKz may include four sub-blocks. According to the semiconductor memory device and the method of operating the same according to an embodiment of the present disclosure, the sub-blocks that are included in the memory blocks are not limited thereto, and various numbers of sub-blocks may be included in each of the memory blocks. Meanwhile, each of the plurality of memory cells, included in the memory cell array, may store at least one bit of data. In an embodiment, each of the plurality of memory cells, included in the memory cell array 110, may be a single-level cell (SLC) storing one bit of data. In another embodiment, each of the plurality of memory cells, included in the memory cell array 110, may be a multi-level cell (MLC) that stores two bits of data. In still another embodiment, each of the plurality of memory cells, included in the memory cell array 110, may be a triple-level cell that stores three bits of data. In still another embodiment, each of the plurality of memory cells, included in the memory cell array 110, may be a quad-level cell that stores four bits of data. According to an embodiment, the memory cell array 110 may include a plurality of memory cells, each storing five or more bits of data.

The address decoder 120, the read and write circuit 130, and the control logic 140 may operate as a peripheral circuit that drives the memory cell array 110. The address decoder 120 may be connected to the memory cell array 110 through the word lines WL. The address decoder 120 may be configured to operate in response to control of the control logic 140. The address decoder 120 may receive an address through an input/output buffer (not shown) that is inside the semiconductor memory device 100.

The address decoder 120 may be configured to decode a block address, among the received addresses. The address decoder 120 may select at least one memory block according to the decoded block address. In addition, the address decoder 120 may apply a read voltage Vread that is generated in the voltage generator 150 to a selected word line of the selected memory block at a time of a read voltage application operation during a read operation and may apply a pass voltage Vpass to the remaining unselected word lines. In addition, during a program verify operation, the address decoder 120 may apply a verify voltage that is generated in the voltage generator 150 to the selected word line of the selected memory block and may apply the pass voltage Vpass to the remaining unselected word lines.

The address decoder 120 may be configured to decode a column address of the received addresses. The address decoder 120 may transmit the decoded column address to the read and write circuit 130.

A read operation and a program operation of the semiconductor memory device 100 may be performed in a page unit. Addresses that are received at a time of a request of the read operation and the program operation include a block address, a row address, and a column address. The address decoder 120 may select one memory block and one word line according to the block address and the row address. The column address may be decoded by the address decoder 120 and may be provided to the read and write circuit 130.

The address decoder 120 may include a block decoder, a row decoder, a column decoder, an address buffer, and the like.

The read and write circuit 130 may include a plurality of page buffers PB1 to PBm. The read and write circuit 130 may operate as a "read circuit" during a read operation of the memory cell array 110 and may operate as a "write circuit" during a write operation of the memory cell array 110. The plurality of page buffers PB1 to PBm may be connected to the memory cell array 110 through the bit lines BL1 to BLm. During the read operation and the program verify operation, in order to sense a threshold voltage of the memory cells, the plurality of page buffers PB1 to PBm may sense a change in the amount of current that is flowing, according to a program state of a corresponding memory cell, through a sensing node while continuously supplying a sensing current to the bit lines that are connected to the memory cells, and latches the sensed change as sensing data. The read and write circuit 130 may operate in response to page buffer control signals that are output from the control logic 140.

During the read operation, the read and write circuit 130 may sense data of the memory cell, temporarily store read data, and output data DATA to the input/output buffer (not shown) of the semiconductor memory device 100. As an exemplary embodiment, the read and write circuit 130 may include a column selection circuit, and the like, in addition to the page buffers (or page registers).

The control logic 140 may be connected to the address decoder 120, the read and write circuit 130, and the voltage generator 150. The control logic 140 may receive a command CMD and a control signal CTRL through the input/ output buffer (not shown) of the semiconductor memory device 100. The control logic 140 may be configured to control the overall operations of the semiconductor memory device 100 in response to the control signal CTRL. In addition, the control logic 140 may output a control signal for adjusting a sensing node precharge potential level of the plurality of page buffers PB1 to PBm. The control logic 140 may control the read and write circuit 130 to perform the read operation of the memory cell array 110.

Meanwhile, during the program operation, the control logic 140 may determine operation voltages that are applied to the word lines WL of the memory cell array 110. In an embodiment, the control logic 140 may determine a first under drive voltage based on a program voltage and a verify voltage. The first under drive voltage may be a voltage that is applied to a select word line after the program voltage is applied and before the verify voltage is applied. The first under drive voltage may be a voltage for quickly decreasing the voltage level of a local word line. The control logic 140 may control the peripheral circuit to perform the program operation by using the determined operation voltages.

In another embodiment, the control logic 140 may determine the first under drive voltage based on the number of program loops performed so far.

Meanwhile, the control logic 140 may determine a second under drive voltage and a third under drive voltage based on a plurality of verify voltages. The second under drive voltage and the third under drive voltage may be voltages that are applied between the verify voltages. For example, the second under drive voltage may be a voltage that quickly decreases the voltage level of the local word line from the third verify voltage to the second verify voltage. In addition, the third under drive voltage may be a voltage that quickly decreases the voltage level of the local word line from the second verify voltage to the first verify voltage.

As another embodiment, the control logic 140 may determine a first over drive voltage and a second over drive voltage based on the plurality of verify voltages. The first over drive voltage and the second over drive voltage may be voltages that are applied between the verify voltages. For example, the first over drive voltage may be a voltage that quickly increases the voltage level of the local word line from the first verify voltage to the second verify voltage. In addition, the second over drive voltage may be a voltage that quickly increases the voltage level of the local word line from the second verify voltage to the third verify voltage.

The voltage generator 150 may generate various operation signals in response to a control signal that is output from the control logic 140. For example, during the read operation, the voltage generator may generate a read voltage Vread. In addition, during the program operation, the voltage generator 150 may generate a program voltage Vpgm, a program pass voltage Vpass, and the like.

Figure 2:
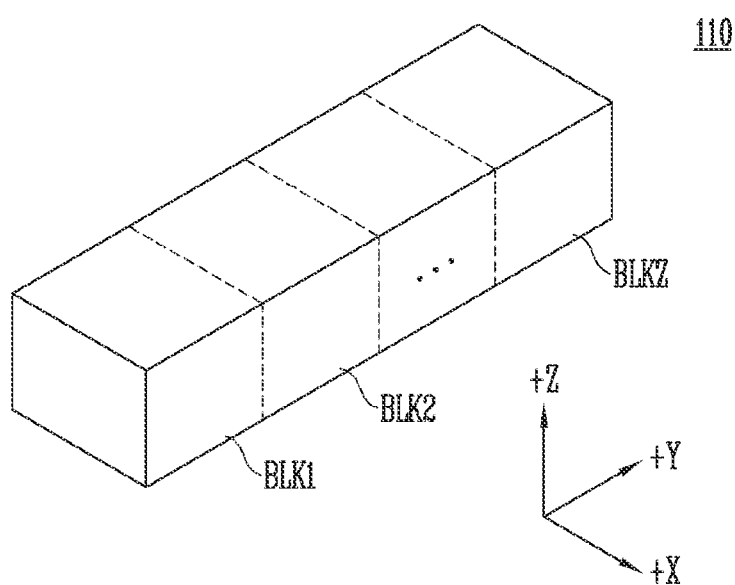
FIG. 2 is a block diagram illustrating an embodiment of a memory cell array of FIG. 1.

FIG. 2 is a block diagram illustrating an embodiment of the memory cell array of FIG. 1.

Referring to FIG. 2, the memory cell array 110 may include a plurality of memory blocks BLK1 to BLKz. Each memory block may have a three-dimensional structure. Each memory block may include a plurality of memory cells that are stacked on a substrate. Such plurality of memory cells may be arranged along a +X direction, a +Y direction, and a +Z direction. A structure of each memory block that is configured in a three-dimensional structure is described in more detail with reference to FIGS. 3B and 3C. On the other hand, in another embodiment, each memory block of the memory cell array 110 may have a two-dimensional struc-ture. A memory block with a two-dimensional structure is described in more detail with reference to FIG. 3A.

Figure 3A:
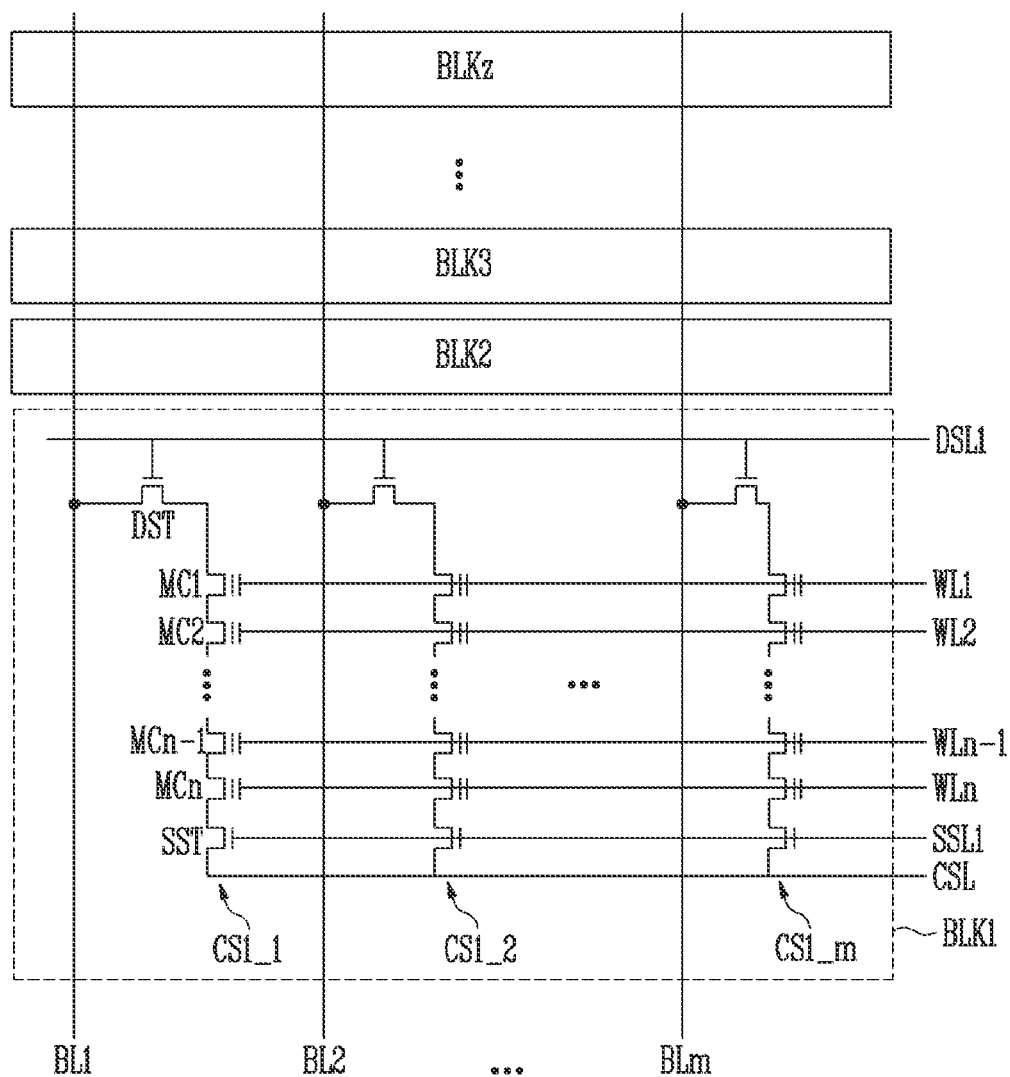
FIGS. 3A, 3B, and 3C are diagrams illustrating different embodiments of the memory cell array of FIG. 1.
Figure 3B:
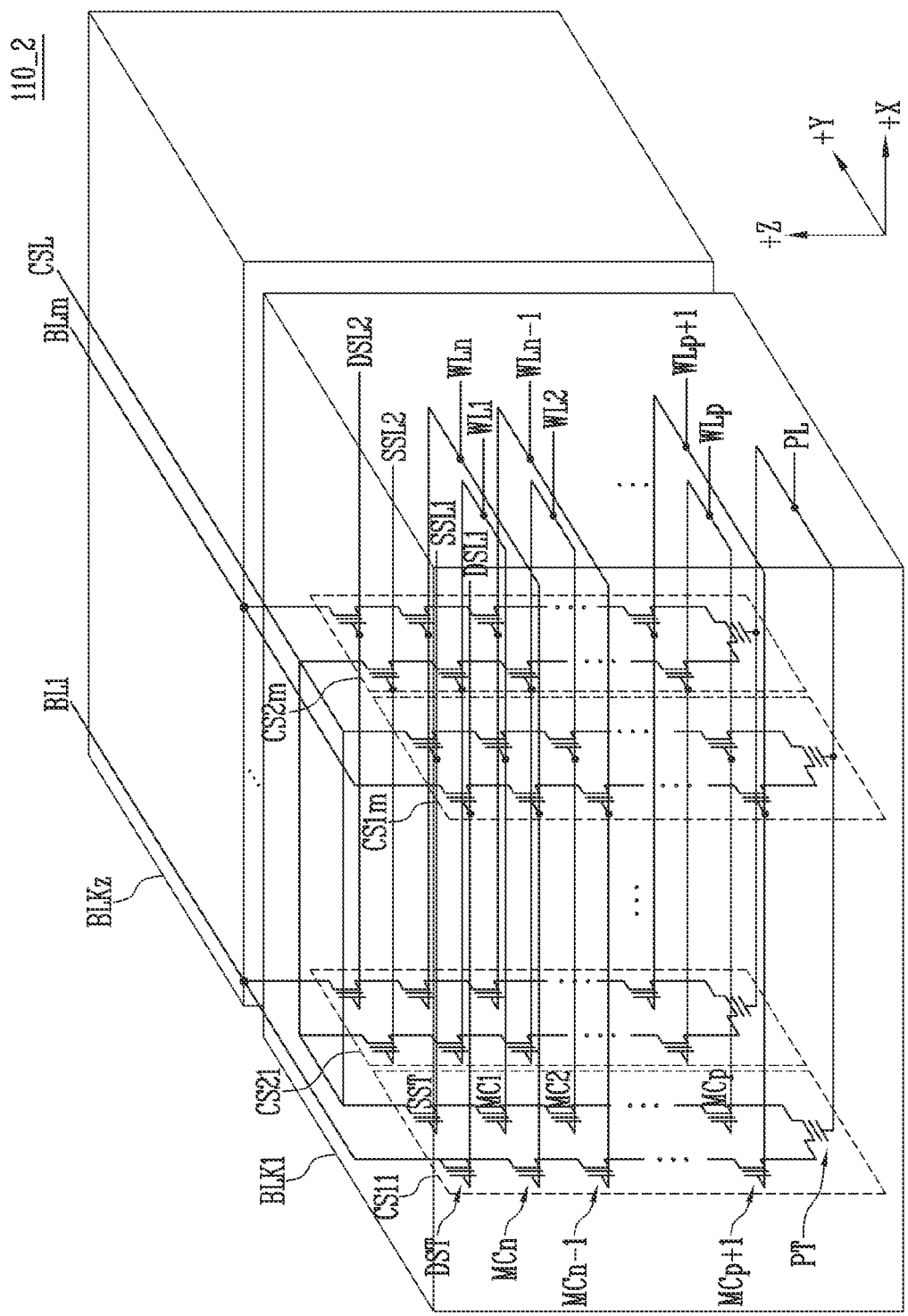
Figure 3C:
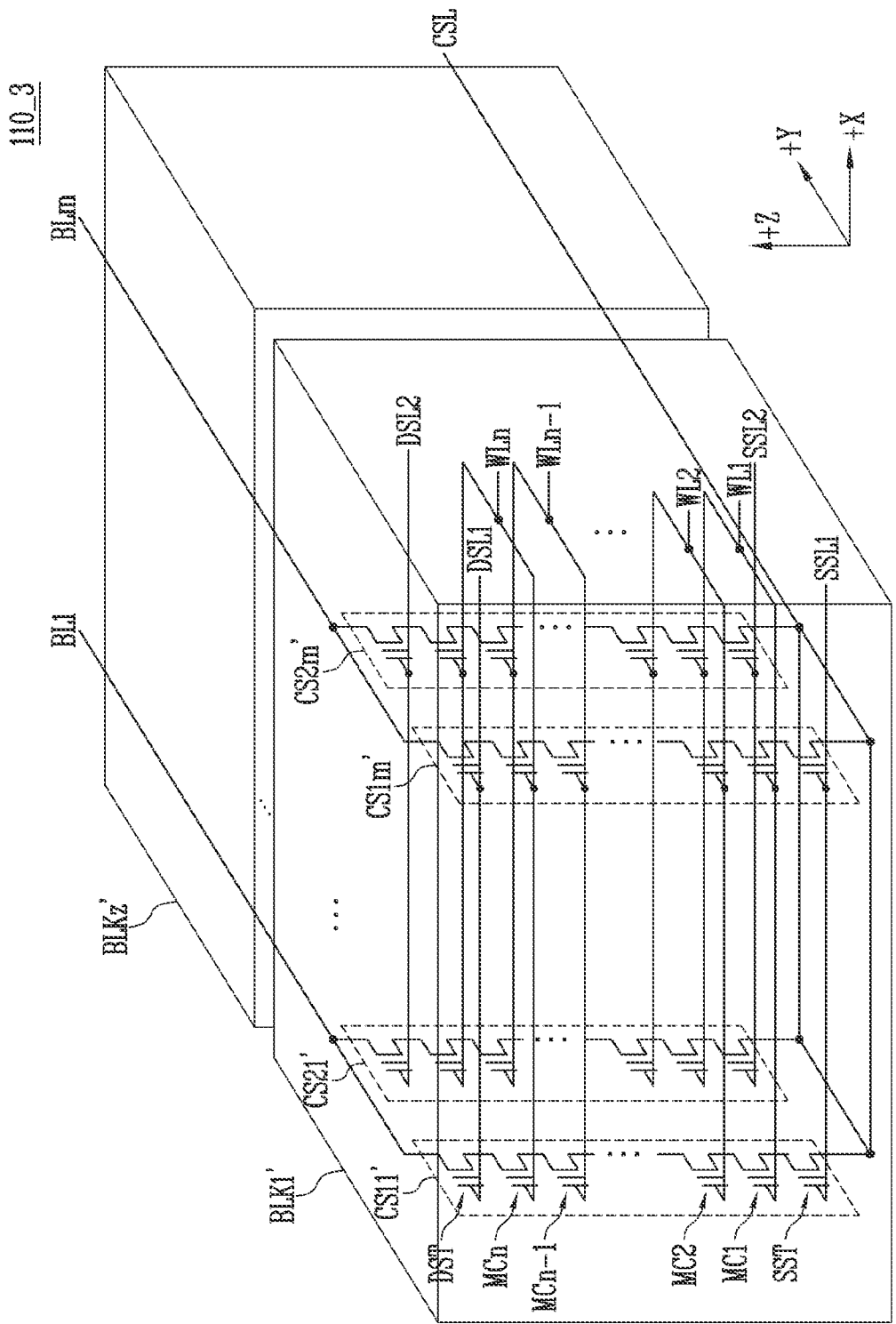

FIGS. 3A, 3B, and 3C are diagrams illustrating different embodiments of the memory cell array of FIG. 1.

Referring to FIG. 3A, first to z-th memory blocks BLK1 to BLKz that are included in a memory cell array 110_1 may be commonly connected to first to m-th bit lines BL1 to BLm. In FIG. 3A, for convenience of description, elements that are included in the first memory block BLK1, among the plurality of memory blocks, BLK1 to BLKz are shown, and elements that are included in each of the remaining memory blocks BLK2 to BLKz are omitted. It will be understood that each of the remaining memory blocks BLK2 to BLKz is configured similarly to the first memory block BLK1.

The memory block BLK1 may include a plurality of cell strings CS1_1 to CS1_$m$. The first to m-th cell strings CS1_1 to CS1_$m$ may be connected to the first to m-th bit lines BL1 to BLm, respectively.

Each of the first to m-th cell strings CS1_1 to CS1_$m$ may include a drain select transistor DST, a plurality of serially connected memory cells MC1 to MCn, and a source select transistor SST. The drain select transistor DST may be connected to a drain select line DSL1. The first to n-th memory cells MC1 to MCn may be connected to first to n-th word lines WL1 to WLn, respectively. The source select transistor SST may be connected to a source select line SSL1. A drain side of the drain select transistor DST may be connected to a corresponding bit line. The drain select transistors of the first to m-th cell strings CS1_1 to CS1_$m$ may be connected to the first to m-th bit lines BL1 to BLm, respectively. A source side of the source select transistor SST may be connected to a common source line CSL. As an embodiment, the common source line CSL may be commonly connected to the first to z-th memory blocks BLK1 to BLKz.

The drain select line DSL1, the first to n-th word lines WL1 to WLn, and the source select line SSL1 may be controlled by the address decoder 120. The common source line CSL may be controlled by the control logic 140. The first to m-th bit lines BL1 to BLm may be controlled by the read and write circuit 130.

According to that shown in FIG. 3A, the memory cell array 110 of the semiconductor memory device 100 may be configured as a memory cell array 110_1 with a two-dimensional structure. However, according to an embodiment, the memory cell array 110 of the semiconductor memory device 100 may be configured as a memory cell array with a three-dimensional structure. The memory cell array with the three-dimensional structure is described later with reference to FIGS. 3B and 3C.

FIG. 36 is a diagram illustrating another embodiment 110_2 of the memory cell array 110 of FIG. 1.

Referring to FIG. 36, the memory cell array 110_2 may include a plurality of memory blocks BLK1 to BLKz. In FIG. 36, for convenience of recognition, an internal configuration of the first memory block BLK1 is shown and an internal configuration of the remaining memory blocks BLK2 to BLKz is omitted. It will be understood that the second to z-th memory blocks BLK2 to BLKz are configured similarly to the first memory block BLK1.

Referring to FIG. 36, the first memory block BLK1 may include a plurality of cell strings CS11 to CS1$m$ and CS21 to CS2$m$. As an embodiment, each of the plurality of cell strings CS11 to CS1$m$ and CS21 to CS2$m$ may be formed in a 'U' shape. In the first memory block BLK1, m cell strings may be arranged in a row direction (that is, the +X direction). In FIG. 33, two cell strings may be arranged in a column direction (that is, the +Y direction). However, this is for convenience of description and it may be understood that three or more cell strings may be arranged in the column direction.

Each of the plurality of cell strings CS11 to CS1m and CS21 to CS2m may include at least one source select transistor SST, first to n-th memory cells MC1 to MCn, a pipe transistor PT, and at least one drain select transistor DST.

Each of the select transistors SST and DST and the memory cells MC1 to MCn may have a similar structure. As an embodiment, each of the select transistors SST and DST and the memory cells MC1 to MCn may include a channel layer, a tunneling insulating film, a charge storage film, and a blocking insulating film. As an embodiment, a pillar for providing the channel layer may be provided in each cell string. As an embodiment, a pillar for providing at least one of the channel layer, the tunneling insulating film, the charge storage film, and the blocking insulating film may be provided in each cell string.

The source select transistor SST of each cell string may be connected between a common source line CSL and the memory cells MC1 to MCp.

As an embodiment, the source select transistors of the cell strings that are arranged in the same row may be connected to a source select line that extends in the row direction, and the source select transistors of the cell strings that are arranged in different rows may be connected to different source select lines. In FIG. 3B, the source select transistors of the cell strings CS11 to CS1m of a first row may be connected to a first source select line SSL1. The source select transistors of the cell strings CS21 to CS2m of a second row may be connected to a second source select line SSL2.

As another embodiment, the source select transistors of the cell strings CS11 to CS1m and CS21 to CS2m may be commonly connected to one source select line.

The first to n-th memory cells MC1 to MCn of each cell string may be connected between the source select transistor SST and the drain select transistor DST.

The first to n-th memory cells MC1 to MCn may be divided into first to p-th memory cells MC1 to MCp and (p+1)-th to n-th memory cells MCp+1 to MCn. The first to p-th memory cells MC1 to MCp may be sequentially arranged in a direction opposite to the +Z direction and may be connected in series between the source select transistor SST and the pipe transistor PT. The (p+1)-th to n-th memory cells MCp+1 to MCn may be sequentially arranged in the +Z direction and may be connected in series between the pipe transistor PT and the drain select transistor DST. The first to p-th memory cells MC1 to MCp and the (p+1)-th to n-th memory cells MCp+1 to MCn may be connected to each other through the pipe transistor PT. Gates of the first to n-th memory cells MC1 to MCn of each cell string may be connected to the first to n-th word lines WL1 to WLn, respectively.

A gate of the pipe transistor PT of each cell string may be connected to a pipeline PL.

The drain select transistor DST of each cell string may be connected between a corresponding bit line and the memory cells MCp+1 to MCn. The cell strings that are arranged in the row direction may be connected to the drain select line extending in the row direction. The drain select transistors of the cell strings CS11 to CS1m of the first row may be connected to a first drain select line DSL1. The drain select transistors of the cell strings CS21 to CS2m of the second row may be connected to a second drain select line DSL2.

The cell strings that are arranged in the column direction may be connected to the bit lines that extend in the column direction. In FIG. 3B, the cell strings CS11 and CS21 of the first column may be connected to the first bit line BL1. The cell strings CS1m and CS2m of the m-th column may be connected to the m-th bit line BLm.

The memory cells that are connected to the same word line in the cell strings that are arranged in the row direction may configure one page. For example, the memory cells that are connected to the first word line WL1, among the cell strings CS11 to CS1m of the first row configure one page. The memory cells, among the cell strings CS21 to CS2m of the second row, connected to the first word line WL1, may configure another page. The cell strings that are arranged in one row direction may be selected by selecting any one of the dram select lines DSL1 and DSL2. One page of the selected cell strings may be selected by selecting any one of the word lines WL1 to WLn.

FIG. 3C is a diagram illustrating still another embodiment 110_3 of the memory cell array 110 of FIG. 1.

Referring to FIG. 3C, the memory cell array 110_3 may include a plurality of memory blocks BLK1' to BLKz'. In FIG. 3C, for convenience of recognition, an internal configuration of the first memory block BLK1' is shown and an internal configuration of the remaining memory blocks BLK2' to BLKz' is omitted. It will be understood that the second to z-th memory blocks BLK2' to BLKz' are configured similarly to the first memory block BLK1'.

The first memory block BLK1' may include a plurality of cell strings CS11' to CS1m' and CS21' to CS2m'. Each of the plurality of cell strings CS11' to CS1m' and CS21' to CS2m' may extend along the +Z direction. In the first memory block BLK1', m cell strings may be arranged in the +X direction. In FIG. 3C, two cell strings may be arranged in the +Y direction. However, this is for convenience of description, and it will be understood that three or more cell strings may be arranged in the column direction.

Each of the plurality of cell strings CS11' to CS1m' and CS21' to CS2m' may include at least one source select transistor SST, the first to n-th memory cells MC1 to MCn, and at least one drain selector transistor DST.

The source select transistor SST of each cell string may be connected between the common source line CSL and the memory cells MC1 to MCn. The source select transistors of the cell strings that are arranged in the same row may be connected to the same source select line. The source select transistors of the cell strings CS11' to CS1m' that are arranged in a first row may be connected to a first source select line SSL1. The source select transistors of the cell strings CS21' to CS2m' that are arranged in a second row may be connected to a second source select line SSL2. As another embodiment, the source select transistors of the cell strings CS11' to CS1m' and CS21' to CS2m' may be commonly connected to one source select line.

The first to n-th memory cells MC1 to MCn of each cell string may be connected in series between the source select transistor SST and the drain select transistor DST. Gates of the first to n-th memory cells MC1 to MCn may be connected to first to the n-th word lines WL1 to WLn, respectively.

The drain select transistor DST of each cell string may be connected between a corresponding bit line and the memory cells MC1 to MCn. The drain select transistors of the cell strings that are arranged in the row direction may be connected to a drain select line extending in the row direction. The drain select transistors of the cell strings CS11' to CS1m' of a first row may be connected to a first drain select line DSL1. The drain select transistors of the cell strings CS21' to CS2m' of a second row may be connected to a second drain select line DSL2.

As a result, the memory block BLK1' of FIG. 3C has an circuit similar to that of the memory block BLK1 of FIG. 3B, except that the pipe transistor PT is excluded from each cell string.

Figure 4:
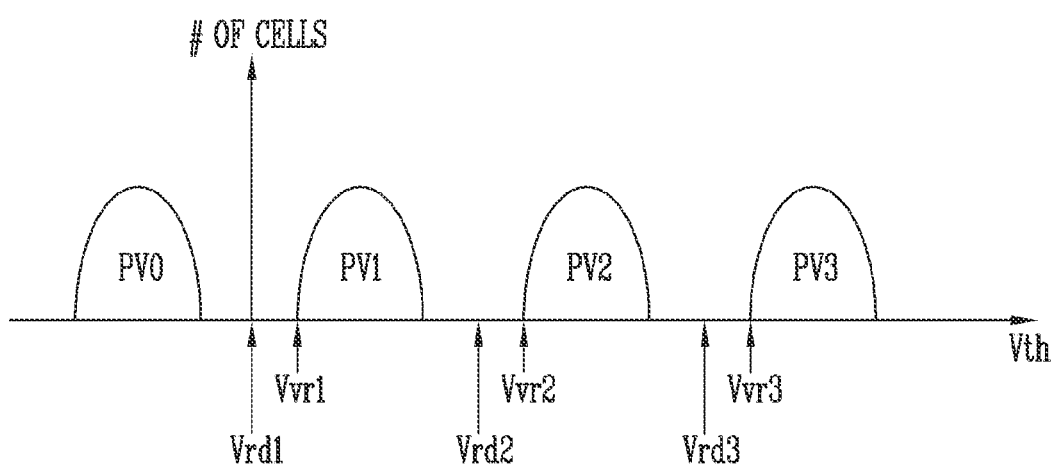
FIG. 4 is a diagram illustrating an example of a threshold voltage distribution of memory cells that are included in the semiconductor memory device of FIG. 1.

FIG. 4 is a diagram illustrating an example of a threshold voltage distribution of memory cells that are included in the semiconductor memory device of FIG. 1. Specifically, FIG. 4 illustrates a threshold voltage distribution in a case in which each of the memory cells that is included in the semiconductor memory device is an MLC that stores two bits of data.

In FIG. 4, a horizontal axis may indicate a threshold voltage of the memory cells, and a vertical axis may indicate the number of memory cells. FIG. 4 illustrates a case in which the memory cells have an erase state PV0, a first program state PV1, a second program state PV2, and a third program state PV3. However, this is only an example for describing the present disclosure, and the number of program states that the memory cells may have is not limited to a specific shape and may be variously configured. For example, the memory cells that are included in the memory cell array 110 of the semiconductor memory device 100 may be an SLC that stores one bit of data. In another example, the memory cells that are included in the memory cell array 110 of the semiconductor memory device 100 may be a TLC that stores three bits of data. In still another example, the memory cells that are included in the memory cell array 110 of the semiconductor memory device 100 may be a QLC that stores four bits of data. In still another example, the memory cells that are included in the memory cell array 110 of the semiconductor memory device 100 may be memory cells that are capable of storing 5 bits or more bits of data.

Since rewriting is impossible on a nonvolatile memory device, an erase operation may be performed on the memory cells prior to performing the program operation so that the memory cells are in the erase state PV0. After the memory cells are in the erase state PV0, a program loop may be performed on the memory cells a plurality of times to program the memory cells to any one of the erase state PV0 and the first to third program states PV1 to PV3.

Here, threshold voltages of the memory cells in the first program state PV1 may be formed to be at higher voltage level than a first verify voltage Vvr1, a threshold voltage of the memory cells in the second program state PV2 may be formed to be at a higher voltage level than a second verify voltages Vvr2, and a threshold voltage of the memory cells in the third program state PV3 may be formed to be at a higher voltage level than a third verify voltage Vvr3. In an embodiment, the first verify voltage Vvr1, the second verify voltage Vvr2, and the third verify voltage Vvr3 may be at a higher voltage level than a ground voltage.

Meanwhile, during the read operation of the semiconductor memory device, first to third read voltages Vrd1 to Vrd3 may be applied to read a threshold voltage state corresponding to data stored in the memory cell. The first read voltage Vrd1 may have a value that is lower than that of the first verify voltage Vvr1. The second read voltage Vrd2 may have a value that is lower than that of the second verify voltage Vvr2. The third read voltage Vrd3 may have a value that is lower than that of the third verify voltage Vvr3.

Figure 5A:
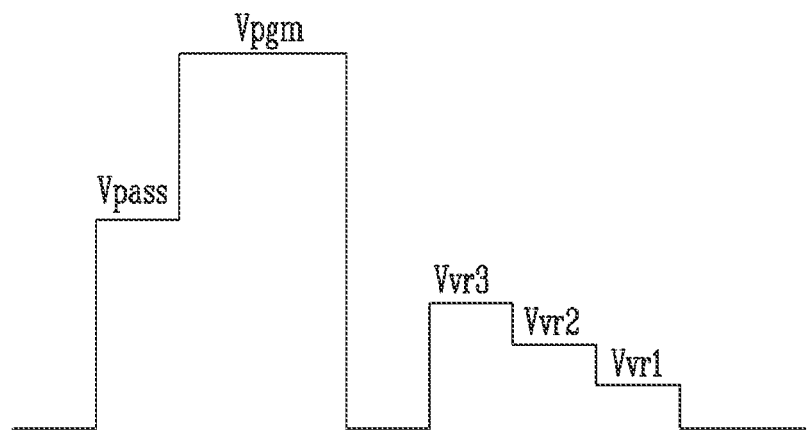
FIG. 5A is a diagram illustrating a voltage that is applied to a selected word line in one program loop among a plurality of program loops included in a program operation.
Figure 5B:
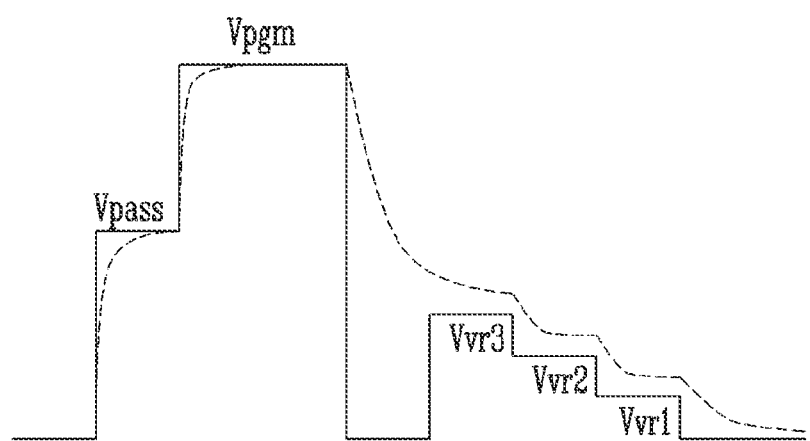
FIG. 5B is a diagram illustrating a voltage appearing on an actual word line when a voltage is applied to the selected word line according to an example of FIG. 5A.

FIG. 5A is a diagram illustrating a voltage that is applied to the selected word line in one program loop among the plurality of program loops included in the program operation. FIG. 5B is a diagram illustrating a voltage appearing on an actual word line when the voltage is applied to the selected word line according to an example of FIG. 5A.

Referring to FIG. 5A, the voltage that is applied to the selected word line during one program loop is shown. More specifically, referring to FIG. 5A, the voltage of the selected word line may increase to the pass voltage Vpass and then increase to the program voltage Vpgm. As the voltage of the selected word line increases to the program voltage Vpgm, a threshold voltage of program allowable cells, among the memory cells that are connected to the selected word line, may increase.

Thereafter, the verify operation on the selected memory cells may be performed. To this end, the third verify voltage Vvr3, the second verify voltage Vvr2, and the first verify voltage Vvr1 may be sequentially applied to the selected word line. As described above, as the program voltage Vpgm and the verify voltages are applied to the selected word line, one program loop may be completed. The program loop may be repeatedly performed until each of the threshold voltages of the selected memory cells increases to a target voltage level.

Referring to FIG. 5B, when the voltage is applied to the selected word line as shown in FIG. 5A, the voltage of the actual word line is shown by a dotted line. As shown in FIG. 5B, the voltage level of an actual local word line may be indicated as a dotted line due to an RC delay of a global word line, a word line switch, a local word line, and the like. In FIG. 5B, when the voltage difference between the program voltage Vpgm and the third verify voltage Vvr3 is large, the voltage of the selected word line may slowly decrease due to the RC delay. This may result in a problem in which the voltage level of the select word line is maintained at a higher voltage level than the verify voltages Vvr3, Vvr2, and Vvr1 during the verify operation. Accordingly, the voltage level of the selected word line may quickly decrease by applying an under drive voltage before applying the verify voltages and after applying the program voltage Vpgm. The under drive voltage is described with reference to FIGS. 6A and 6B.

Figure 6A:
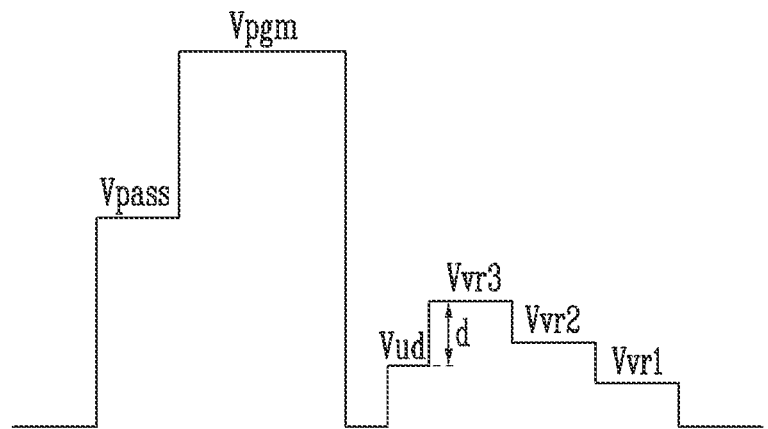
FIG. 6A is another diagram illustrating the voltage that is applied to the selected word line in one program loop among the plurality of program loops included in the program operation.
Figure 6B:
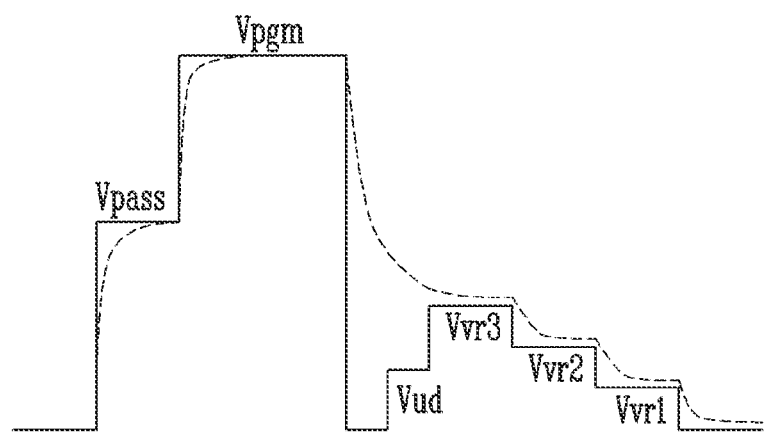
FIG. 6B is a diagram illustrating the voltage appearing on the actual word line when the voltage is applied to the selected word line according to an example of FIG. 6A.

FIG. 6A is another diagram illustrating the voltage that is applied to the selected word line in one program loop among the plurality of program loops included in the program operation. FIG. 6B is a diagram illustrating the voltage that appears on the actual word line when the voltage is applied to the selected word line according to an example of FIG. 6A.

Referring to FIG. 6A, the voltage that is applied to the selected word line during one program loop is shown. More specifically, referring to FIG. 6A, the voltage of the selected word line may increase to the pass voltage Vpass and then increase to the program voltage Vpgm. As the voltage of the selected word line increases to the program voltage Vpgm, the threshold voltage of the program allowable cells, among the memory cells that are connected to the selected word line, may increase.

Thereafter, the verify operation may be performed on the selected memory cells. To this end, the third verify voltage Vvr3, the second verify voltage Vvr2, and the first verify voltage Vvr1 may be sequentially applied to the selected word line. However, before the verify voltages Vvr3, Vvr2, and Vvr1 are applied to the select word line, a first under drive voltage Vud may be applied. The first under drive voltage Vud may be at a lower voltage level than the third verify voltage Vvr3, which is first applied among the verify voltages Vvr3, Vvr2, and Vvr1, by d volts. After the under drive voltage Vud is applied to the selected word line, the verify voltages Vvr3, Vvr2, and Vvr1 may be sequentially applied.

Referring to FIG. 6B, when the voltage is applied to the selected word line as shown in FIG. 6A, the voltage of the actual word line is shown by a dotted line. As shown in FIG. 6B, the voltage level of the actual local word line may appear as a dotted line due to the RC delay of the global word line, the word line switch, the local word line, and the like. In FIG. 6B, since the first under drive voltage is applied after the program voltage Vpgm is applied and before the verify voltages are applied, the voltage level of the selected word line may be quickly decreased.

Comparing FIGS. 5B and 6B, in the case of FIG. 5B, after the program voltage Vpgm is applied to the selected word line, the third verify voltage Vvr3 may be applied. Accordingly, the voltage of the selected word line decreases relatively slowly. In the case of FIG. 6B, after the program voltage Vpgm is applied to the selected word line, the first under drive voltage Vud that is at a lower voltage level than the third verify voltage Vvr3 may be applied. Accordingly, the voltage of the selected word line may decrease relatively quickly.

Figure 7:
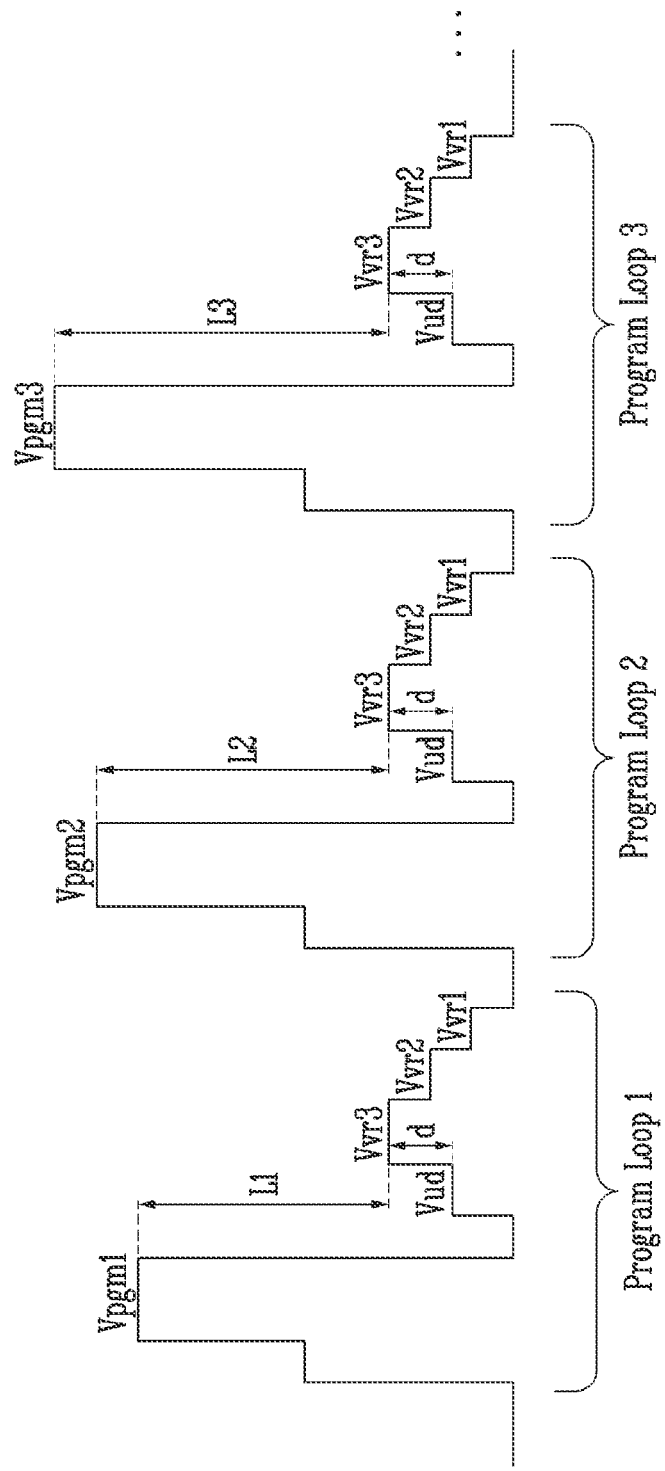
FIG. 7 is a diagram illustrating a program operation using a constant first under drive voltage.

FIG. 7 is a diagram illustrating the program operation using a constant first under drive voltage.

Referring to FIG. 7, three program loops that are included in the program operation are illustrated. As the program loop is repeated, the program voltage may increase. As shown in FIG. 7, a first program voltage Vpgm1 may be applied in a first program loop, a second program voltage Vpgm2 may be applied in a second program loop, and a third program voltage Vpgm3 may be applied in a third program loop. The second program voltage Vpmg2 may be at a higher voltage level than the first program voltage Vpgm1, and the third program voltage Vpmg3 may be at a higher voltage level than the second program voltage Vpgm2.

Referring to FIG. 7, in each program loop, before the verify voltages Vvr3, Vvr2, and Vvr1 are applied, the first under drive voltage Vud that is applied to the selected word line may have a constant magnitude. More specifically, in the embodiment, shown in FIG. 7, the first under drive voltage Vud that is applied in each program loop may be at a lower voltage level than the third verify voltage Vvr3 by d volts. At this time, since the program voltage increases as the program loop increases, a difference between the program voltage and the third verify voltage Vvr3 may increase.

Specifically, the difference between the first program voltage Vpgm1 and the third verify voltage Vvr3 in the first program loop may be L1 volts, the difference between the second program voltage Vpgm2 and the third verify voltage Vvr3 in the second program loop may be L2 volts, and the difference between the third program voltage Vpgm3 and the third verify voltage Vvr3 in the third program loop may be L3 volts. As shown in FIG. 7, L2 may be higher than L1, and L3 may be higher than L2. That is, as the number of program loops increases, the difference between the program voltage and the third verify voltage increases. On the contrary, according to the embodiment of FIG. 7, the difference between the first under drive voltage Vud and the third verify voltage Vvr3 may be constant, even though the number of program loops increases. In this case, in the first program loop, the voltage of the selected word line may be quickly decreased to a value that is adjacent to the third verify voltage Vvr3 by the first under drive voltage Vud, but the speed at which the voltage of the selected word line approaches the third verify voltage Vvr3 may be reduced. Accordingly, when the number of program loops is repeated, a problem may occur in which the voltage level of the selected word line is maintained at a higher voltage level than the verify voltages Vvr3, Vvr2, and Vvr1 during the verify operation.

According to the semiconductor memory device and the method of operating the same, the first under drive voltage that is applied in each program loop may be determined based on the program voltage and the third verify voltage Vvr3. Accordingly, even though the program loop is repeated, the voltage of the selected word line may be quickly decreased to the value that is adjacent to the third verify voltage Vvr3 based on the adaptively determined first under drive voltage Vud. Hereinafter, the semiconductor memory device and the method of operating the same, according to an embodiment of the present disclosure, are described with reference to FIG. 8, FIG. 8 is a diagram illustrating a method of determining a first under drive voltage according to an embodiment of the present disclosure.

Figure 8:
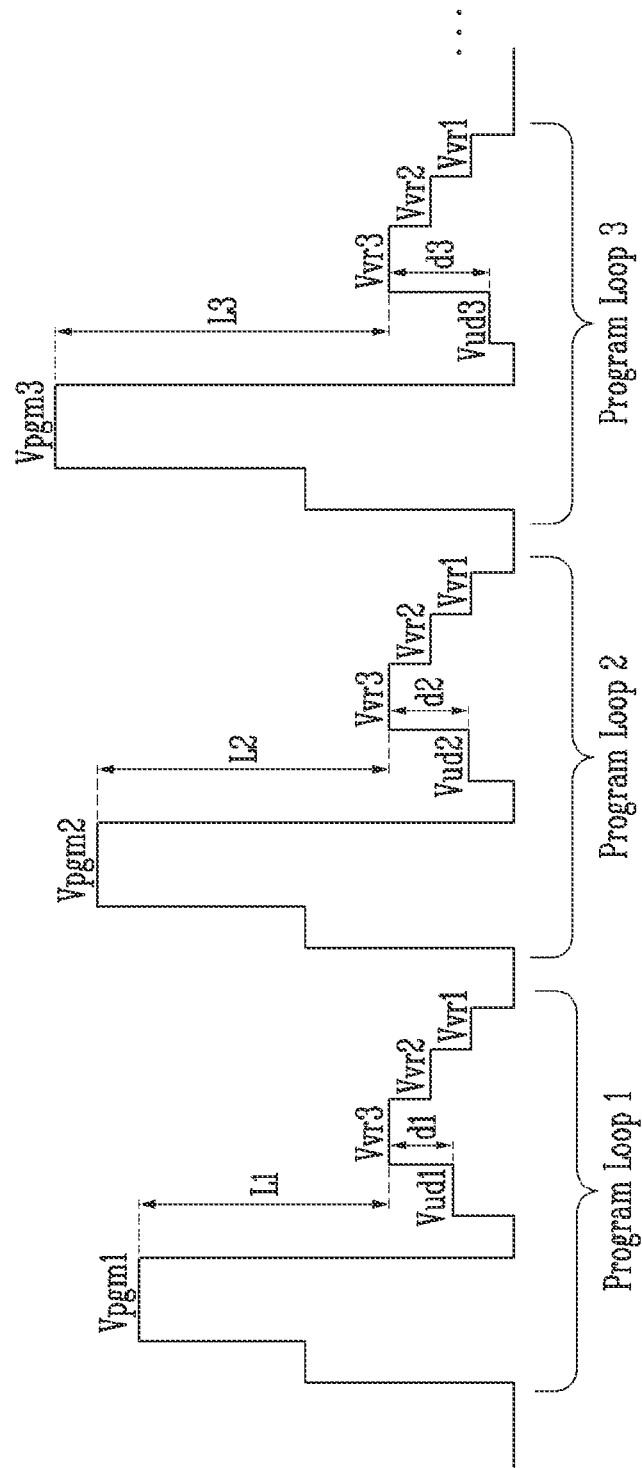
FIG. 8 is a diagram illustrating a method of determining a first under drive voltage according to an embodiment of the present disclosure.

Referring to FIG. 8, similarly to FIG. 7, three program loops included in the program operation are illustrated. As shown in FIG. 8, the first program voltage Vpgm1 may be applied in the first program loop, the second program voltage Vpgm2 may be applied in the second program loop, and the third program voltage Vpgm3 may be applied in the third program loop.

Referring to FIG. 8, a first under drive voltage Vud1 that is applied during the first program loop has a voltage value that is at a lower voltage level than the third verify voltage Vvr3 by d1. In addition, a first under drive voltage Vud2 that is applied during the second program loop has a voltage value that is at a lower voltage level than the third verify voltage Vvr3 by d2. Meanwhile, a first under drive voltage Vud3 that is applied during the third program loop has a voltage value that is at a lower voltage level than the third verify voltage Vvr3 by d3, d2 may be higher than d1, and d3 may be higher than d2.

In an embodiment, the values of d1, d2, and d3 may be determined according to the number of program loops. That is, the control logic 140 may determine the values of d1, d2, and d3 for calculating the first under drive voltages Vud1, Vud2, Vud3, . . . based on the number of program loops. In this case, the relationship between the first under drive voltage, the program voltage, and the third verify voltage that is applied in an arbitrary program loop may be expressed as Equation below.

$$\text{Vud}(i) = \text{Vvr3} - k1 * i \qquad \text{[Equation 1]}$$

(Here, i is a natural number indicating the number of program loops, k1 is a real number greater than 0, and Vud(i) is the first under drive voltage in an i-th program loop.)

In another embodiment, the values of d1, d2, and d3 may be determined based on the values of L1, L2, and L3, respectively. For example, in determining the first under drive voltages Vud1, Vud2, Vud3, . . . that are applied in each program loop, the first under drive voltages Vud1, Vud2, Vud3, . . . may be determined so that the differences d1, d2, and d3 between the third verify voltage Vvr3 and the first under drive voltages Vud1, Vud2, Vud3, . . . are proportional to the differences L1, L2, L3, . . . between the program voltages Vpgm1, Vpgm2, Vpgm3, and the third verify voltage Vvr3, respectively. In this case, the relationship between the first under drive voltage, the program voltage, and the third verify voltage that is applied in an arbitrary program loop may be expressed as Equation 2 below.

$$\text{Vvr3} - \text{Vud}(i) = k2 * (\text{Vpgm}(i) - \text{Vvr3}) \qquad \text{[Equation 2]}$$

(Here, i is a natural number greater than 0, k2 is a real number greater than 0, Vud(i) is the first under drive voltage in the i-th program loop, and Vpgm(i) is the program voltage in the i-th program loop.)

As described above, according to an embodiment of the disclosure, shown in FIG. 8, when the number of program loops increases, as the program voltages Vpgm1, Vpgm2, Vpgm3, increase, the difference d1, d2, d3, . . . between the first under drive voltages Vud1, Vud2, Vud3, . . . and the third verify voltage Vvr3 may also increase. Accordingly, even though the program loop is repeated, the voltage of the selected word line may be quickly decreased to the value that is adjacent to the third verify voltage Vvr3 based on the adaptively determined first under drive voltages Vud1, Vud2, Vud3, . . . .

Figure 9:
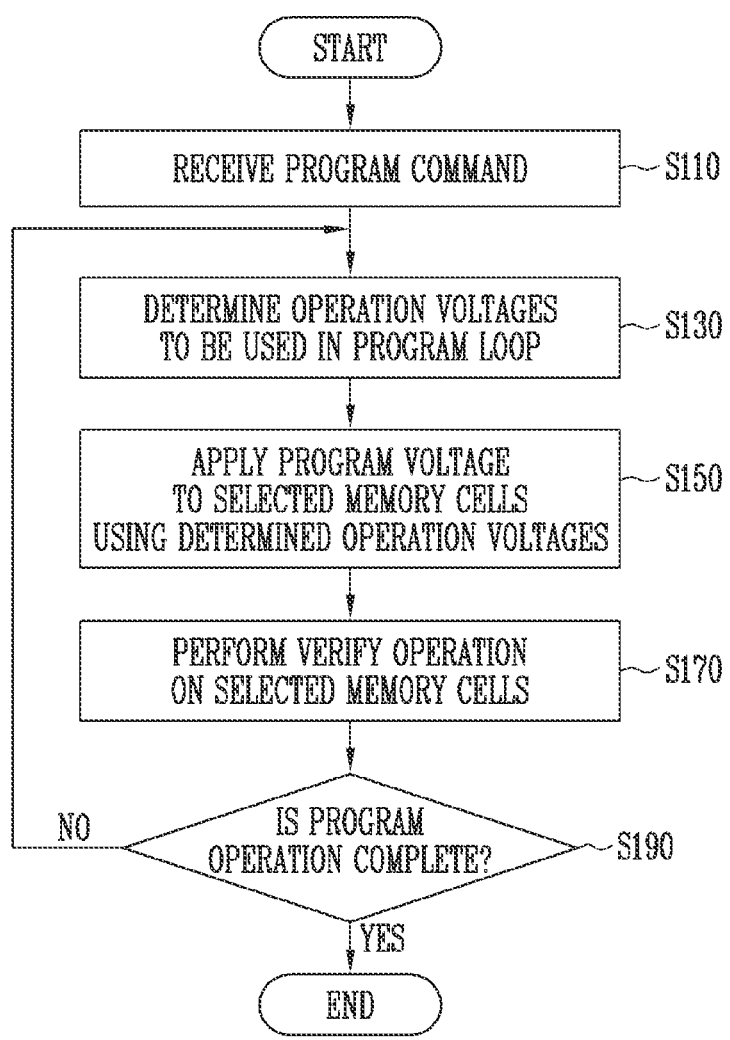
FIG. 9 is a flowchart illustrating a method of operating a semiconductor memory device according to an embodiment of the disclosure.

FIG. 9 is a flowchart illustrating a method of operating a semiconductor memory device according to an embodiment of the disclosure.

Referring to FIG. 9, the method of operating the semiconductor memory device may include receiving a program command (S110), determining the operation voltages to be used in the program loop (S130), applying the program voltage to the selected memory cells using the determined operation voltages (S150), performing the verify operation on the selected memory cells (S170), and determining whether the program operation is complete (S190).

In step S110, the semiconductor memory device 100 may receive the program command and program data from a controller. The semiconductor memory device 100 may program the received program data to the selected memory cells in response to the program command.

The program operation on the selected memory cells may include a plurality of program loops. In FIG. 9, steps S130, S150, and S170 may configure one program loop. In step S130, operation voltages to be used in a current program loop may be determined. In step S130, the program voltage Vpgm, the verify voltages, and the first under drive voltage may be determined. In step S130, the first under drive voltage may be adaptively determined for each program loop. An exemplary embodiment of step S130 is described in detail with reference to FIGS. 10, 11, 17 and 20.

In step S150, the program voltage may be applied to the selected memory cells by using the determined operation voltages. More specifically, in step S150, the program voltage that is determined in step S130 may be applied to the select word line that is connected to the selected memory cells. An exemplary embodiment of step S150 is described in detail with reference to FIG. 12.

In step S170, the verify operation on the selected memory cells may be performed. To this end, the first under drive voltage may be applied to the selected word line, and the third to first verify voltages Vvr3, Vvr2, and Vvr1 may be sequentially applied. An exemplary embodiment of step S170 is described in detail with reference to FIGS. 13, 18 and 21.

When the program loop is ended, it may be determined whether the program operation is completed (S190). When the program operation is completed (S190: Yes), the program operation may be ended. When the program operation is not completed (S190: No), the method may return to step S130 and a subsequent program loop may be performed.

Figure 10:
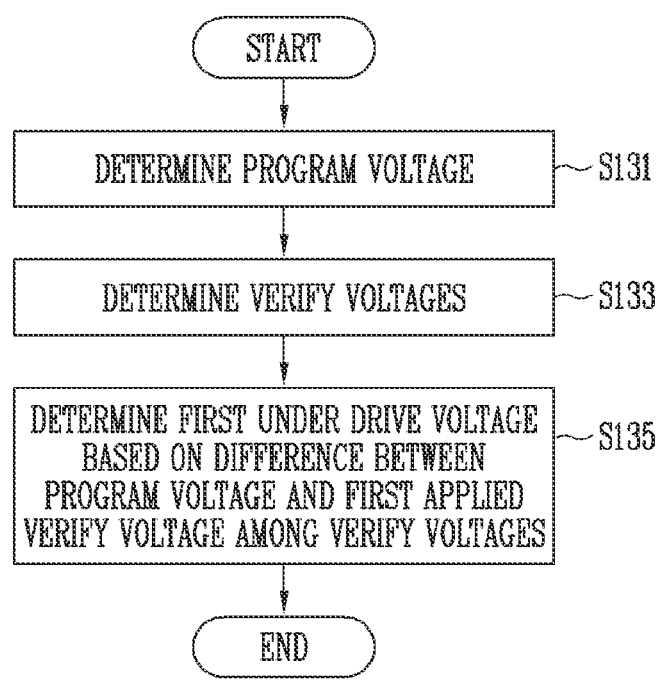
FIG. 10 is a flowchart illustrating an exemplary embodiment of step S130 of FIG. 9.

FIG. 10 is a flowchart illustrating the exemplary embodiment of step S130 of FIG. 9.

Referring to FIG. 10, step S130 of FIG. 9 may include determining the program voltage (S131), determining the verify voltages (S133), and determining the first under drive voltage based on the difference between the program voltage and the verify voltage first applied among the verify voltages (S135).

In step S131, the program voltage may be determined. In an example, as the number of program loops increases, the magnitude of the program voltage that is determined in step S131 may also increase.

In step S133, the verify voltages may be determined. In an example, even though the number of program loops increases, the verify voltages Vvr1, Vvr2, and Vvr3 may have a voltage level of a fixed magnitude. In another example, the magnitude of the verify voltages Vvr1, Vvr2, and Vvr3 may be changed for each program loop. As an example, the magnitude of the verify voltages Vvr1, Vvr2, and Vvr3 may be changed to compensate for noise that is caused by the common source line during the verify operation.

In step S135, the first under drive voltage may be determined based on the difference between the program voltage and the first applied verify voltage. Referring to FIG. 8, the third verify voltage Vvr3, among the plurality of verify voltages Vvr1, Vvr2, and Vvr3, may be first applied. Therefore, in step S135, the first under drive voltage may be determined based on the difference between the program voltage Vpgm and the third verify voltage Vvr3. In this case, the first under drive voltage may be determined by the relationship according to Equation 2 described above.

Figure 11:
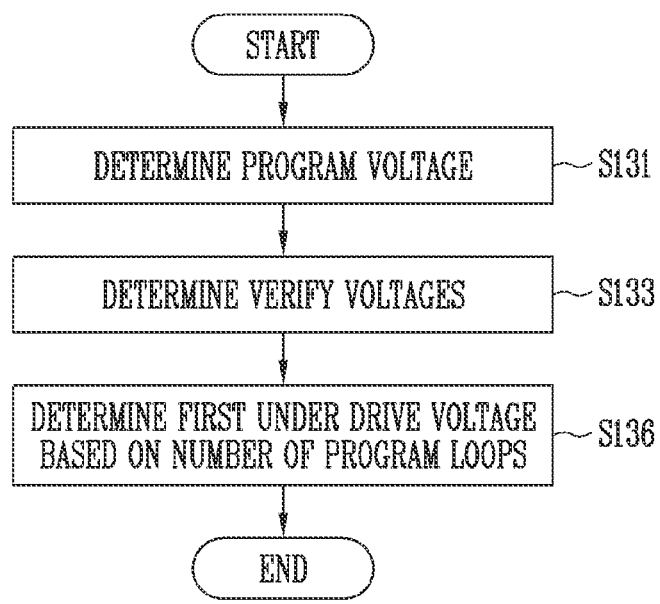
FIG. 11 is a flowchart illustrating another exemplary embodiment of step S130 of FIG. 9.

FIG. 11 is a flowchart illustrating another exemplary embodiment of step S130 of FIG. 9.

Referring to FIG. 11, step S130 of FIG. 9 may include determining the program voltage (S131), determining the verify voltages (S133), and determining the first under drive voltage based on the number of program loops (S136). Steps S131 and S133 of FIG. 11 may be substantially the same as steps S131 and S133 of FIG. 10. Accordingly, a repetitive description is omitted.

In step S136, the first under drive voltage may be determined based on the number of program loops. In this case, the first under drive voltage may be determined by the relationship according to Equation 1, described above.

Figure 12:
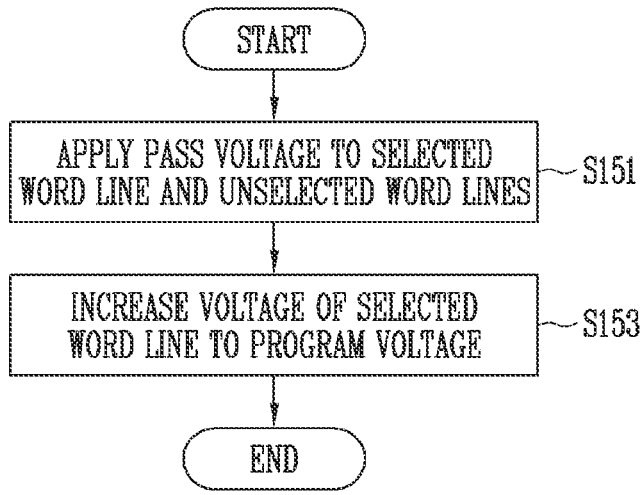
FIG. 12 is a flowchart illustrating an exemplary embodiment of step S150 of FIG. 9.

FIG. 12 is a flowchart illustrating the exemplary embodiment of step S150 of FIG. 9.

Referring to FIG. 12, step S150 of FIG. 9 may include applying the pass voltage to the selected word line and unselected word lines (S151) and increasing the voltage of the selected word line to the program voltage (S153).

In step S151, the pass voltage may be applied to word lines that are connected to a memory block to be subjected to the program operation. That is, the pass voltage may be applied to both of the selected word line and the unselected word line.

In step S153, the voltage of the selected word line may be increased to the program voltage. In the meantime, the voltage that is applied to the unselected word line may be maintained as the pass voltage. Accordingly, memory cells that are connected to the unselected word line might not be programmed. Meanwhile, the memory cells that are connected to the selected word line may be programmed.

Figure 13:
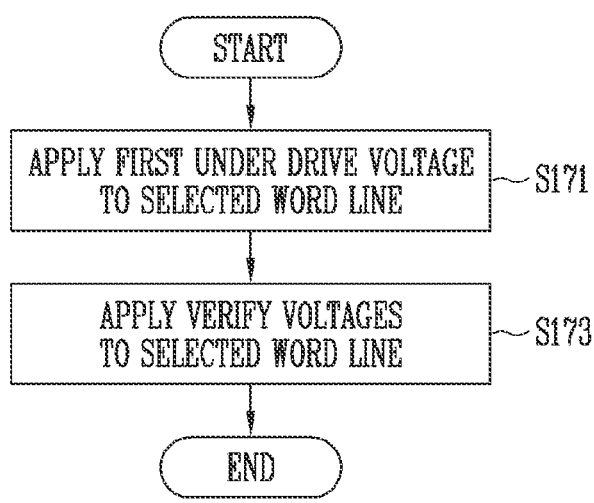
FIG. 13 is a flowchart illustrating an exemplary embodiment of step S170 of FIG. 9.

FIG. 13 is a flowchart illustrating the exemplary embodiment of step S170 of FIG. 9.

Referring to FIG. 13, step S170 of FIG. 9 may include applying the first under drive voltage to the selected word line (S171) and sequentially applying the verify voltages to the selected word line (S173).

In step S171, the first under drive voltage Vud that is determined by step S130 may be applied to the selected word line. The voltage level of the word line to which the program voltage is applied, according to step S150, may be quickly decreased by the first under drive voltage.

Thereafter, the verify voltages may be sequentially applied to the selected word lines in step S173. Referring to FIG. 8, in step S173, the third verify voltage Vvr3, the second verify voltage Vvr2, and the first verify voltage Vvr1 may be sequentially applied to the selected word line.

Figure 14:
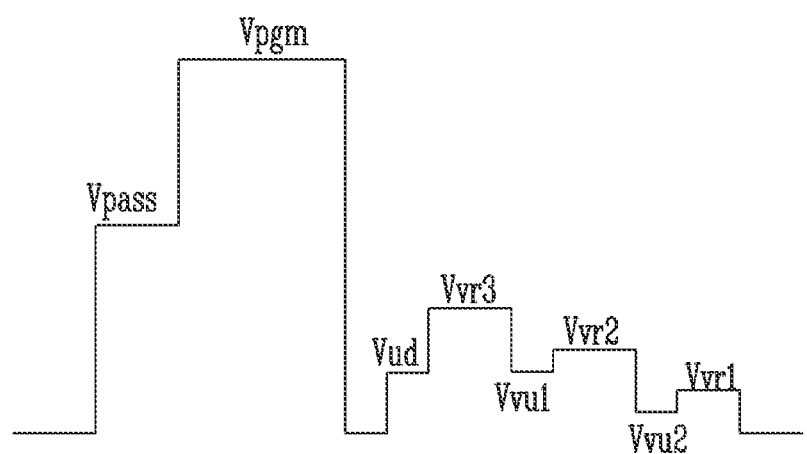
FIG. 14 is a diagram illustrating second and third under drive voltages that are applied between verify voltages.

FIG. 14 is a diagram illustrating the second and third under drive voltages that are applied between the verify voltages.

Referring to FIG. 14, after the pass voltage Vpass and the program voltage Vpgm are applied to the selected word line, the first under drive voltage Vud may be applied. Thereafter, the third verify voltage Vvr3 may be applied to the selected word line. Thereafter, before the second verify voltage Vvr2 is applied, the second under drive voltage Vvu1 may be applied to the selected word line. The second under drive voltage Vvu1 may be a voltage for quickly decreasing the voltage level of the selected word line from the third verify voltage Vvr3 to the second verify voltage Vvr2. Accordingly, the second under drive voltage Vvu1 may be at a lower voltage level than the second verify voltage Vvr2.

After the second verify voltage Vvr2 is applied to the selected word line, the third under drive voltage Vvu2 may be applied to the selected word line before the first verify voltage Vvr1 is applied. The third under drive voltage Vvu2 may be a voltage for quickly decreasing the voltage level of the selected word line from the second verify voltage Vvr2 to the first verify voltage Vvr1. Accordingly, the third under drive voltage Vvu2 may be at a lower voltage level than the first verify voltage Vvr1.

Figure 15:
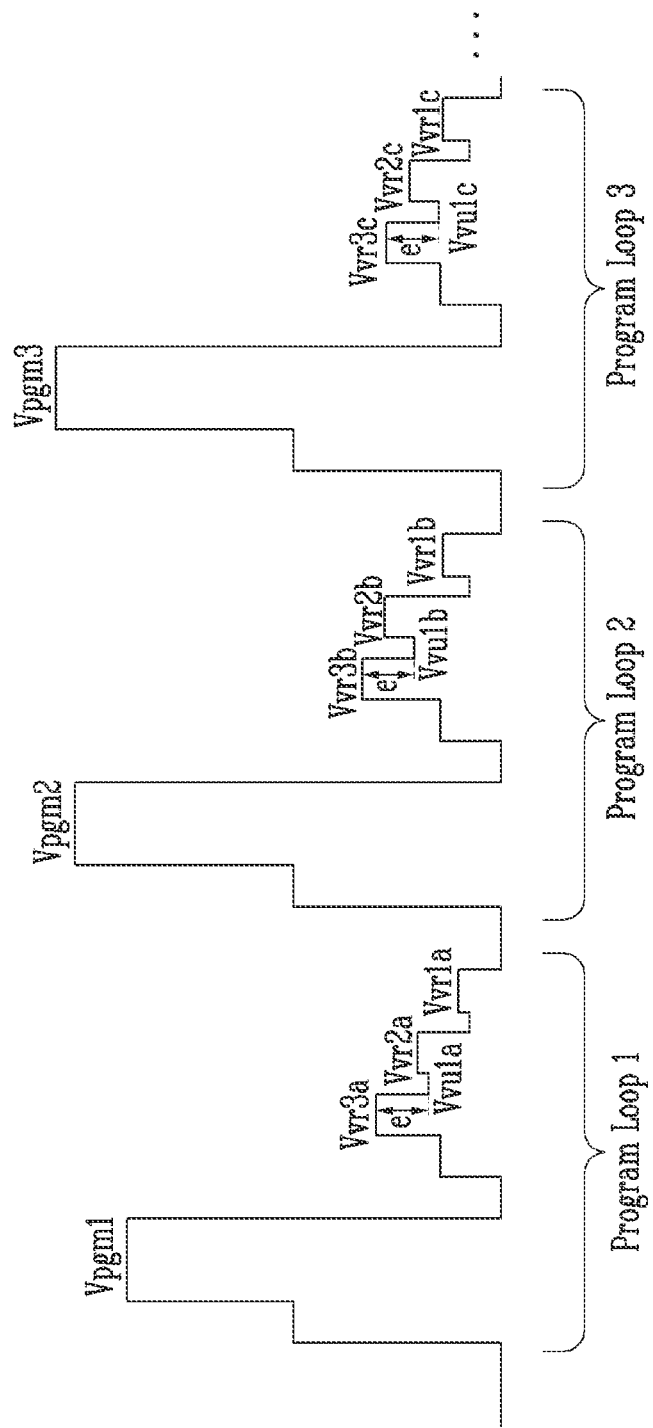
FIG. 15 is a diagram illustrating a program operation using a second under drive voltage with a constant difference.

FIG. 15 is a diagram illustrating a program operation using a second under drive voltage with a constant difference.

Referring to FIG. 15, only three program loops are illustrated among the plurality of program loops. In each program loop, voltages as described with reference to FIG. 14 may be applied to the selected word line.

As described above, as the program loop is repeated, the verify voltages may maintain a constant voltage level, but verify voltages of different magnitudes may be applied to the selected word line for each program loop. As an example, during the verify operation, the magnitudes of the verify voltages Vvr1, Vvr2, and Vvr3 may be changed to compensate for noise of the common source line. Referring to FIG. 15, magnitudes of a first verify voltage Vvr1a of the first program loop, a first verify voltage Vvr1b of the second program loop, and a first verify voltage Vvr1c of the third program loop may be different from each other. Similarly, magnitudes of a second verify voltage Vvr2a of the first program loop, a second verify voltage Vvr2b of the second program loop, and a second verify voltage Vvr2c of the third program loop may be different from each other, and magnitudes of a third verify voltage Vvr3a of the first program loop, a third verify voltage Vvr3b of the second program loop, and a third verify voltage Vvr3c of the third program loop may be different from each other.

According to the embodiment of FIG. 15, even though the magnitudes of the verify voltages are different for each program loop, the second under drive voltage that is applied between the third verify voltage and the second verify voltage may be determined as a voltage that is at a lower voltage level than the third verify voltage by e. That is, a second under drive voltage Vvu1a that is used in the first program loop may be at a lower voltage level than the third verify voltage Vvr3a by e volts. Meanwhile, a second under drive voltage Vvu1b that is used in the second program loop may be at a lower voltage level than the third verify voltage Vvr3b by e volts. In addition, a second under drive voltage Vvu1c that is used in the third program loop may be at a lower voltage level than the third verify voltage Vvr3c by e volts.

That is, according to the embodiment of FIG. 15, even though the difference between the third verify voltage and the second verify voltage is different, the second under drive voltage that is collectively lower than the third verify voltage by e volts may be used. In this case, the speed at which the voltage of the selected word line decreases from the third verify voltage to the second verify voltage varies for each program loop. This reduces the accuracy of the verify operation of the semiconductor memory device. Although the disclosure is described based on the second under drive voltage Vvu1 applied between the third verify voltage Vvr3 and the second verify voltage Vvr2 with reference to FIG. 15, the same problem may occur with respect to the third under drive voltage Vvu2 applied between the second verify voltage Vvr2 and the first verify voltage Vvr1.

According to the semiconductor memory device and the method of operating the same, the second under drive voltage Vvu1 that is applied in each program loop may be determined based on the difference between the third verify voltage Vvr3 and the second verify voltage Vvr2. Accordingly, even though the magnitude of the verify voltages is changed as the program loop is repeated, the voltage of the selected word line may be quickly decreased to a value that is adjacent to the second verify voltage Vvr2 from the third verify voltage Vvr3 based on the adaptively determined second under drive voltage Vvu1. Hereinafter, the semiconductor memory device and the method of operating the same, according to an embodiment of the present disclosure, are described with reference to FIG. 16.

Figure 16:
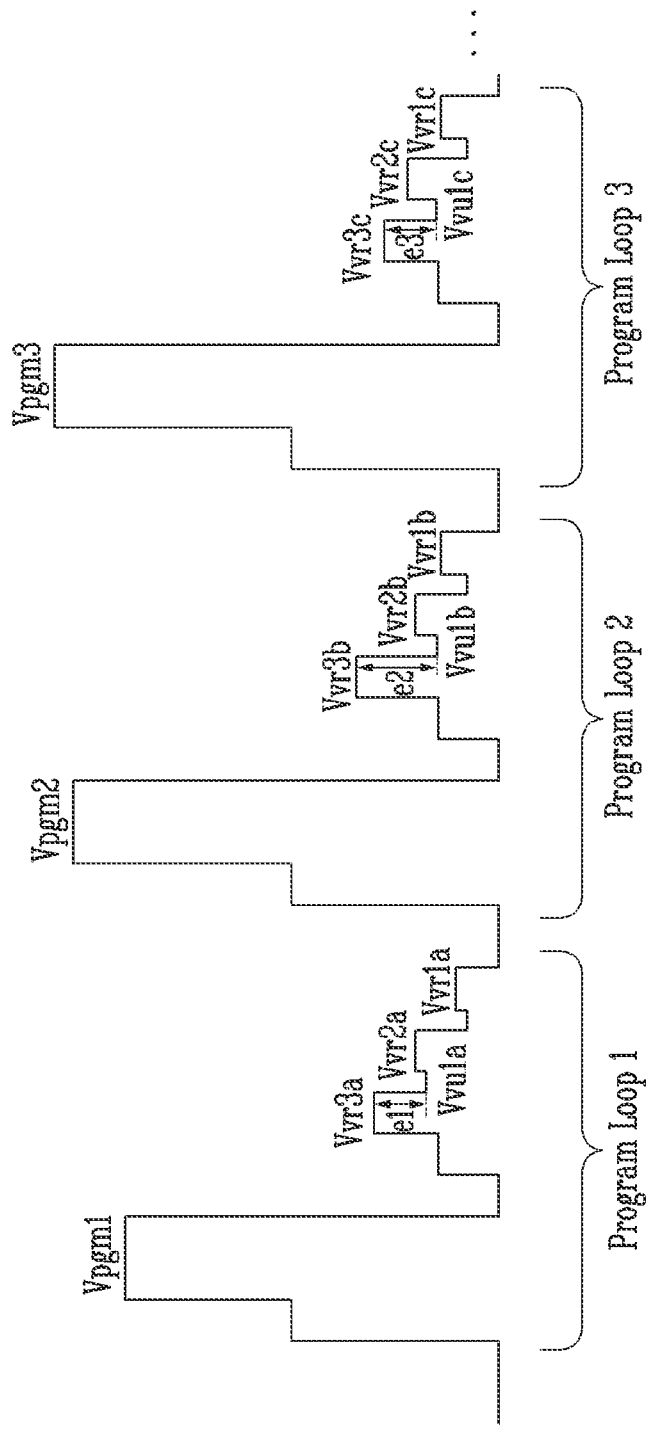
FIG. 16 is a diagram illustrating a method of determining a second under drive voltage according to an embodiment of the present disclosure.

FIG. 16 is a diagram illustrating a method of determining a second under drive voltage according to an embodiment of the present disclosure.

Referring to FIG. 16, when the magnitude of the verify voltages is different for each program loop, the second under drive voltage that is applied between the third verify voltage and the second verify voltage may be determined by the third verify voltage and the second verify voltage. Referring to FIG. 16, the second under drive voltage Vvu1a that is used in the first program loop may be at a lower voltage level than the third verify voltage Vvr3a by e1 volts, and the second under drive voltage Vvu1b that is used in the second program loop may be at a lower voltage level than the third verify voltage Vvr3b by e2 volts. In addition, the second under drive voltage Vvu1c that is used in the third program loop may be at a lower voltage level than the third verify voltage Vvr3c by e3 volts.

In an embodiment of the present disclosure, values of e1, e2, and e3 may be determined based on values of (Vvr3a–Vvr2a), (Vvr3b–Vvr2b), and (Vvr3c–Vvr2c), respectively. For example, in determining the second under drive voltages Vvu1a, Vvu1b, Vvu1c, . . . that are applied in each program loop, the second under drive voltages Vvu1a, Vvu1b, Vvu1c, . . . may be determined so that the differences e1, e2, e3, . . . between the third verify voltages Vvr3a, Vvr3b, Vvr3c, . . . and the second under drive voltages Vvu1a, Vvu1b, Vvu1c, may be proportional to differences between the third verify voltages Vvr3a, Vvr3b, Vvr3c, . . . and the second verify voltages Vvr2a, Vvr2b, Vvr2c, respectively. In this case, the relationship between the second under drive voltage, the third verify voltage, and the second verify voltage that is applied in an arbitrary program loop may be expressed as Equation 3 below.

$$\text{Vvr3}(i)-\text{Vvu1}(i)=k3*(\text{Vvr3}(i)-\text{Vvr2}(i)) \qquad \text{[Equation 3]}$$

(Here, i is a natural number greater than 0, k3 is a real number greater than 0, Vvr3(i) is the third verify voltage in the i-th program loop, Vvr2(i) is the second verify voltage in the i-th program loop, and Vvu1(i) is the second under drive voltage in the i-th program loop.)

Although the method of determining the second under drive voltage has been described above, the third under drive voltage may also be determined in a similar method. That is, in determining the third under drive voltages Vvu2a, Vvu2b, Vvu2c, . . . that are applied in each program loop, the third under drive voltages Vvu2a, Vvu2b, Vvu2c, . . . may be determined so that differences between the second verify voltages Vvr2a, Vvr2b, Vvr2c, . . . and the third under drive voltages Vvu2a, Vvu2b, Vvu2c, . . . may be proportional to differences between the second verify voltages Vvr2a, Vvr2b, Vvr2c, . . . and the first verify voltages Vvr1a, Vvr1b, Vvr1c, . . . , respectively.

Figure 17:
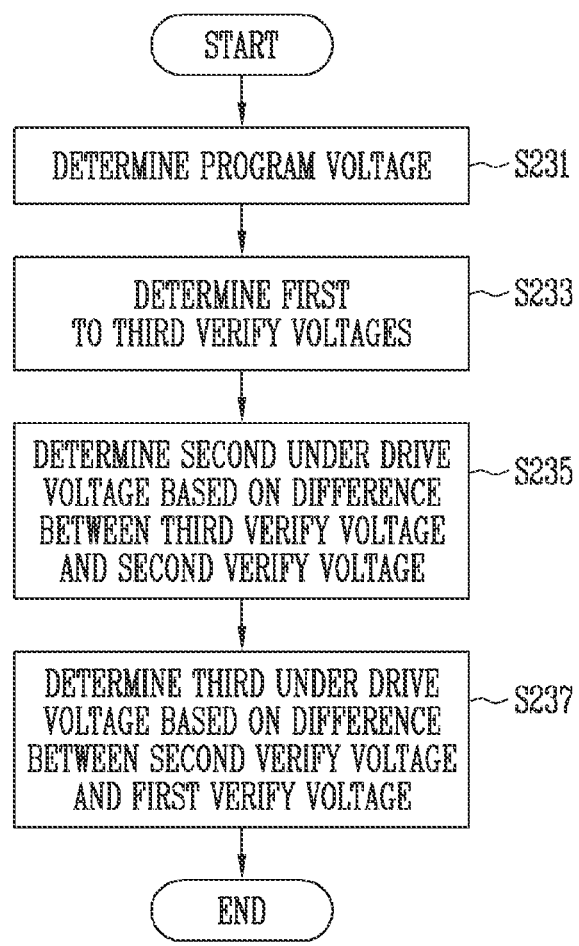
FIG. 17 is a flowchart illustrating still another exemplary embodiment of step S130 of FIG. 9.

FIG. 17 is a flowchart illustrating still another exemplary embodiment of step S130 of FIG. 9.

Referring to FIG. 17, step S130 of FIG. 9 may include determining the program voltage (S231), determining the first to third verify voltages (S233), determining the second under drive voltage Vvu1 based on the difference between the third verify voltage Vvr3 and the second verify voltage Vvr2 (S235), and determining the third under drive voltage Vvu2 based on a difference between the second verify voltage Vvr2 and the first verify voltage Vvr1 (S237).

Steps S231 and S233 of FIG. 17 may be substantially the same as steps S131 and S133 of FIG. 10. Accordingly, a repetitive description is omitted.

In step S235, the second under drive voltage Vvu1 may be determined based on the difference between the third verify voltage Vvr3 and the second verify voltage Vvr2. In this case, the second under drive voltage may be determined by the relationship according to Equation 3 above. Accordingly, the second under drive voltage Vvu1 that is optimized for the third verify voltage Vvr3 and the second verify voltage Vvr2, determined in each program loop, may be determined.

In step S237, the third under drive voltage Vvu2 may be determined based on the difference between the second verify voltage Vvr2 and the first verify voltage Vvr1. Also in this case, the third under drive voltage may be determined by using the relationship according to Equation 3 described above. Accordingly, the third under drive voltage Vvu2 that is optimized for the second verify voltage Vvr2 and the first verify voltage Vvr1, determined in each program loop, may be determined.

Figure 18:
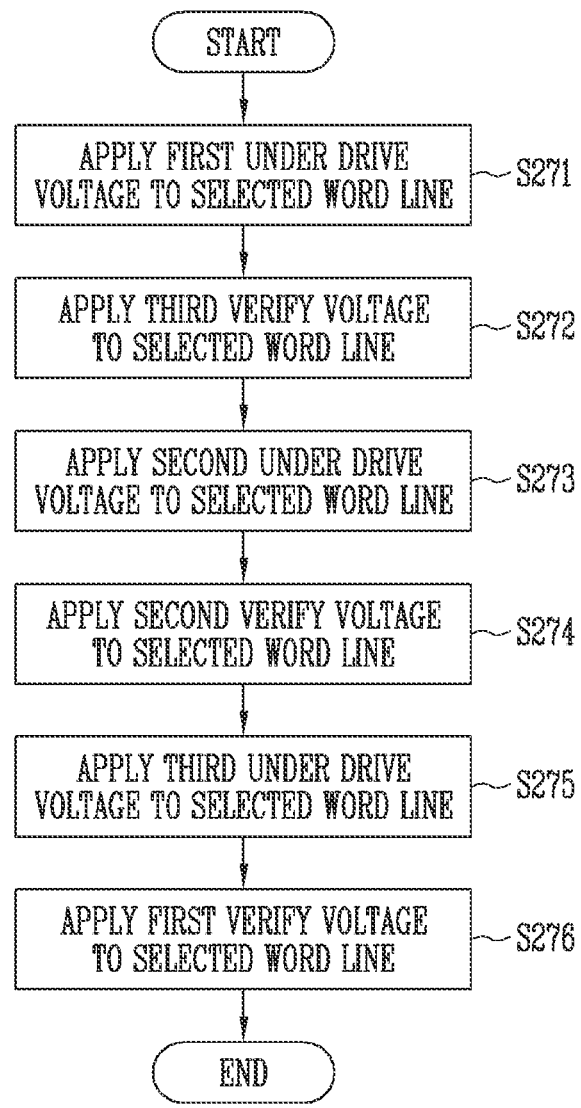
FIG. 18 is a flowchart illustrating another exemplary embodiment of step S170 of FIG. 9.

FIG. 18 is a flowchart illustrating another exemplary embodiment of step S170 of FIG. 9.

Referring to FIG. 18, step S170 of FIG. 9 may include applying the first under drive voltage Vud to the selected word line (S271), applying the third verify voltage Vvr3 to the selected word line (S272), applying the second under drive voltage Vvu1 to the selected word line (S273), applying the second verify voltage Vvr2 to the selected word line (S274), applying the third under drive voltage Vvu2 to the selected word line (S275), and applying the first verify voltage Vvr1 to the selected word line (S276). Referring to FIG. 14 together, since the first under drive voltage Vud is applied to the selected word line after the program voltage Vpgm is applied (S271), the voltage of the selected word line may be quickly decreased to a voltage near the third verify voltage Vvr3. Meanwhile, since the second under drive voltage Vvu1 is applied to the selected word line after the third verify voltage Vvr3 is applied, the voltage of the selected word line may be quickly decreased to a voltage near the second verify voltage Vvr2. Finally, since the third under drive voltage Vvu2 is applied to the selected word line after the second verify voltage Vvr2 is applied, the voltage of the selected word line may be quickly decreased to a voltage near the first verify voltage Vvr1.

The first under drive voltage Vud of step S271 may be determined by step S135 of FIG. 10 or step S136 of FIG. 11. Meanwhile, the second under drive voltage Vvu1 of step S273 may be determined by step S235 of FIG. 17. In addition, the third under drive voltage Vvu2 of step S273 may be determined by step S237 of FIG. 17.

Figure 19:
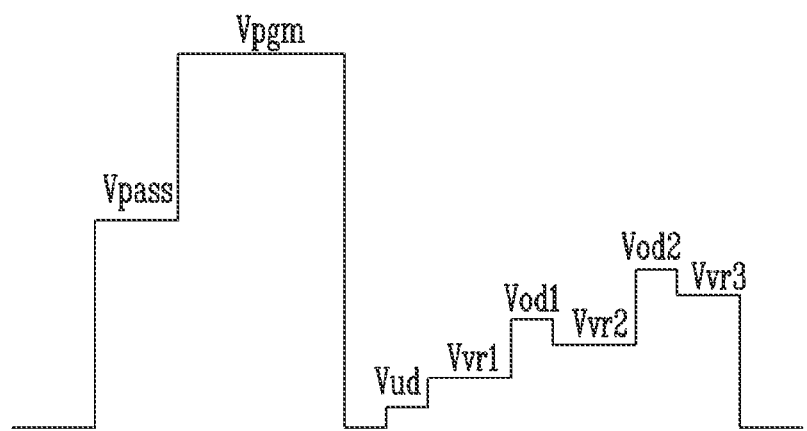
FIG. 19 is a diagram illustrating first and second over drive voltages that are applied between verify voltages.

FIG. 19 is a diagram illustrating the first and second over drive voltages that are applied between the verify voltages. According to the embodiment shown in FIG. 19, during the verify operation, the smallest first verify voltage Vvr1, among verify voltages, may be first applied to the selected word line. Thereafter, the second verify voltage Vvr2 may be applied to the selected word line, and finally, the third largest verify voltage Vvr3 may be applied to the selected word line.

Referring to FIG. 19, after the pass voltage Vpass and the program voltage Vpgm are applied to the selected word line, the first under drive voltage Vud may be applied. Thereafter, the first verify voltage Vvr1 may be applied to the selected word line. Thereafter, before the second verify voltage Vvr2 is applied, a first over drive voltage Von may be applied to the selected word line. The first over drive voltage Von may be a voltage for quickly increasing the voltage level of the selected word line from the first verify voltage Vvr1 to the second verify voltage Vvr2. Accordingly, the first over drive voltage Vod1 may be at a higher voltage level than the second verify voltage Vvr2.

After the second verify voltage Vvr2 is applied to the selected word line, a second over drive voltage Vod2 may be applied to the selected word line before the third verify voltage Vvr3 is applied. The second over drive voltage Vod2 may be a voltage for quickly increasing the voltage level of the selected word line from the second verify voltage Vvr2 to the third verify voltage Vvr3. Accordingly, the second over drive voltage Vod2 may be at a higher voltage level than the third verify voltage Vvr3.

According to the semiconductor memory device and the method of operating the same, the first over drive voltage Vod1 that is applied in each program loop may be determined based on a difference between the first verify voltage Vvr1 and the second verify voltage Vvr2. Accordingly, even though the magnitude of the verify voltages is changed as the program loop is repeated, the voltage of the selected word line may be quickly increased from the first verify voltage Vvr1 to a value that is adjacent to the second verify voltage Vvr2 based on the adaptively determined first under drive voltage Vod1. For example, the first over drive voltage in an arbitrary i-th program loop may be determined based on Equation 4 below.

$$\text{Vod1}(i)-\text{Vvr1}(i)=k4*(\text{Vvr2}(i)-\text{Vvr1}(i)) \qquad \text{[Equation 4]}$$

(Here, i is a natural number greater than 0, k4 is a real number greater than 0, Vvr1(i) is the first verify voltage in the i-th program loop, Vvr2(i) is the second verify voltage in the i-th program loop, and Vod1(i) is the first over drive voltage in the i-th program loop.)

Similarly, according to the semiconductor memory device and the method of operating the same according to an embodiment of the present disclosure, the second over drive voltage Vod2 that is applied in each program loop may be determined based on a difference between the second verify voltage Vvr2 and the third verify voltage Vvr3. Accordingly, even though the magnitude of the verify voltages is changed as the program loop is repeated, the voltage of the selected word line may be quickly increased from the second verify voltage Vvr2 to a voltage that is adjacent to the third verify voltage Vvr3 based on the adaptively determined second over drive voltage Vod2.

Figure 20:
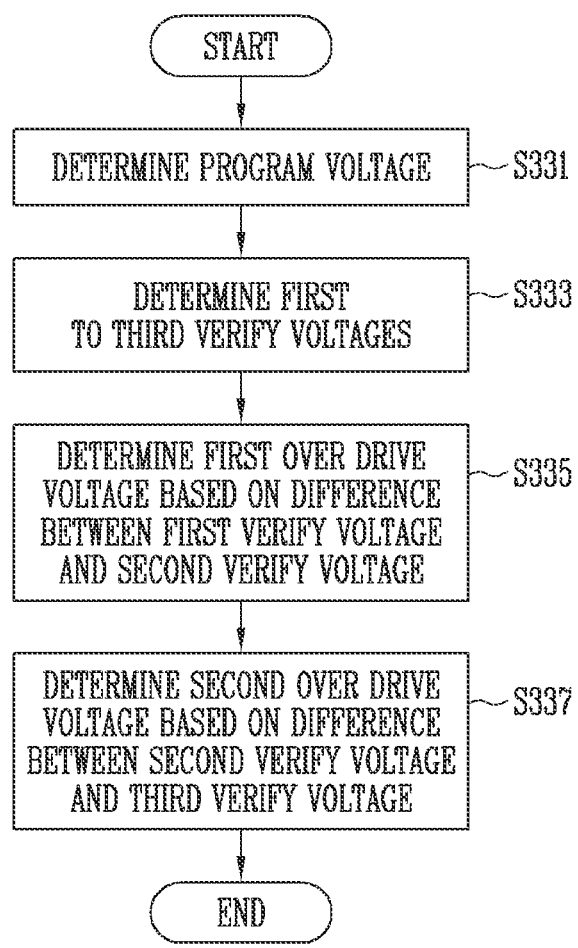
FIG. 20 is a flowchart illustrating still another exemplary embodiment of step S130 of FIG. 9.

FIG. 20 is a flowchart illustrating still another exemplary embodiment of step S130 of FIG. 9.

Referring to FIG. 20, step S130 of FIG. 9 may include determining the program voltage (S331), determining the first to third verify voltages (S333), determining the first over drive voltage Vod1 based on the difference between the second verify voltage Vvr2 and the first verify voltage Vvr1 (S335), and determining the second over drive voltage Vod2 based on the difference between the third verify voltage Vvr3 and the second verify voltage Vvr2 (S337).

Steps S331 and S333 of FIG. 20 may be substantially the same as steps S131 and S133 of FIG. 10. Accordingly, a repetitive description is omitted.

In step S335, the first over drive voltage Vod1 may be determined based on the difference between the second verify voltage Vvr2 and the first verify voltage Vvr1. In this case, the first over drive voltage may be determined by the relationship according to Equation 4 above. Accordingly, the first over drive voltage Vod1 that is optimized for the first verify voltage Vvr1 and the second verify voltage Vvr2, determined in each program loop, may be determined.

In step S337, the second over drive voltage Vod2 may be determined based on the difference between the third verify voltage Vvr3 and the second verify voltage Vvr2. Also in this case, the second over drive voltage may be determined using the relationship according to Equation 4 above. Accordingly, the second over drive voltage Vod2 that is optimized for the second verify voltage Vvr2 and the third verify voltage Vvr3, determined in each program loop, may be determined.

Figure 21:
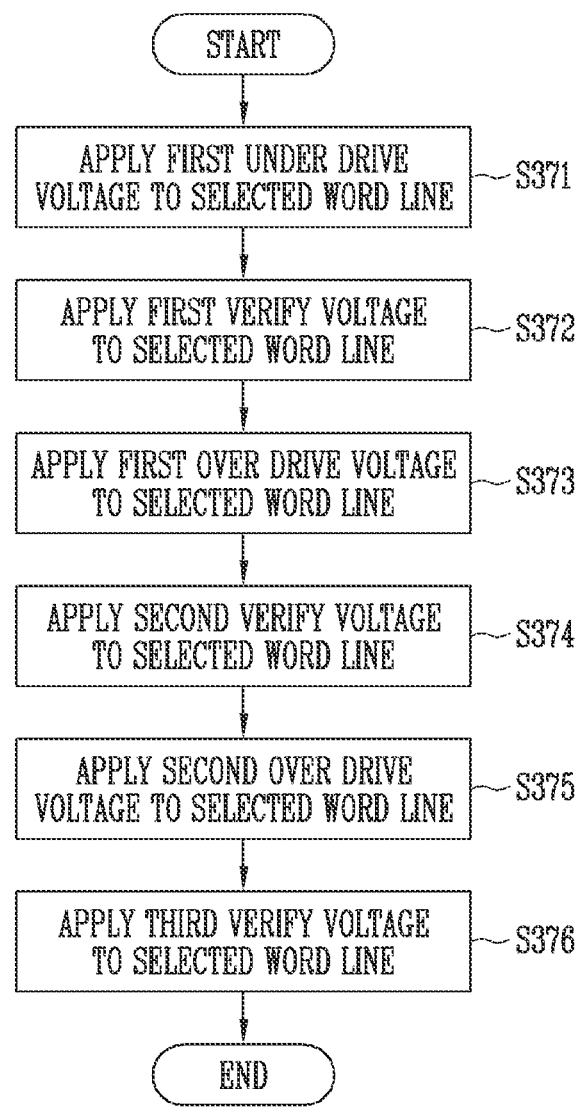
FIG. 21 is a flowchart illustrating still another exemplary embodiment of step S170 of FIG. 9.

FIG. 21 is a flowchart illustrating still another exemplary embodiment of step S170 of FIG. 9.

Referring to FIG. 21, step S170 of FIG. 9 may include applying the first under drive voltage Vud to the selected word line (S371), applying the first verify voltage Vvr1 to the selected word line (S372), applying the first over drive voltage Vod1 to the selected word line (S373), applying the second verify voltage Vvr2 to the selected word line (S374), applying the second over drive voltage Vod2 to the selected word line (S375), and applying the third verify voltage Vvr3 to the selected word line (S376). Referring to FIG. 19 together, since the first under drive voltage Vud is applied to the selected word line after the program voltage Vpgm is applied (S371), the voltage of the selected word line may be quickly decreased to a voltage near the first verify voltage Vvr1. Meanwhile, since the first over drive voltage Vod1 is applied to the selected word line after the first verify voltage Vvr1 is applied, the voltage of the selected word line may be quickly increased to a voltage near the second verify voltage Vvr2. Finally, since the second over drive voltage Vod2 is applied to the selected word line after the second verify voltage Vvr2 is applied, the voltage of the selected word line may be quickly increased to a voltage near the third verify voltage Vvr3.

The first under drive voltage Vud of step S371 may be determined by step S135 of FIG. 10 or step S136 of FIG. 11. Meanwhile, the first over drive voltage Vod1 of step S373 may be determined by step S335 of FIG. 20. In addition, the second over drive voltage Vod2 of step S373 may be determined by step S337 of FIG. 20.

Figure 22:
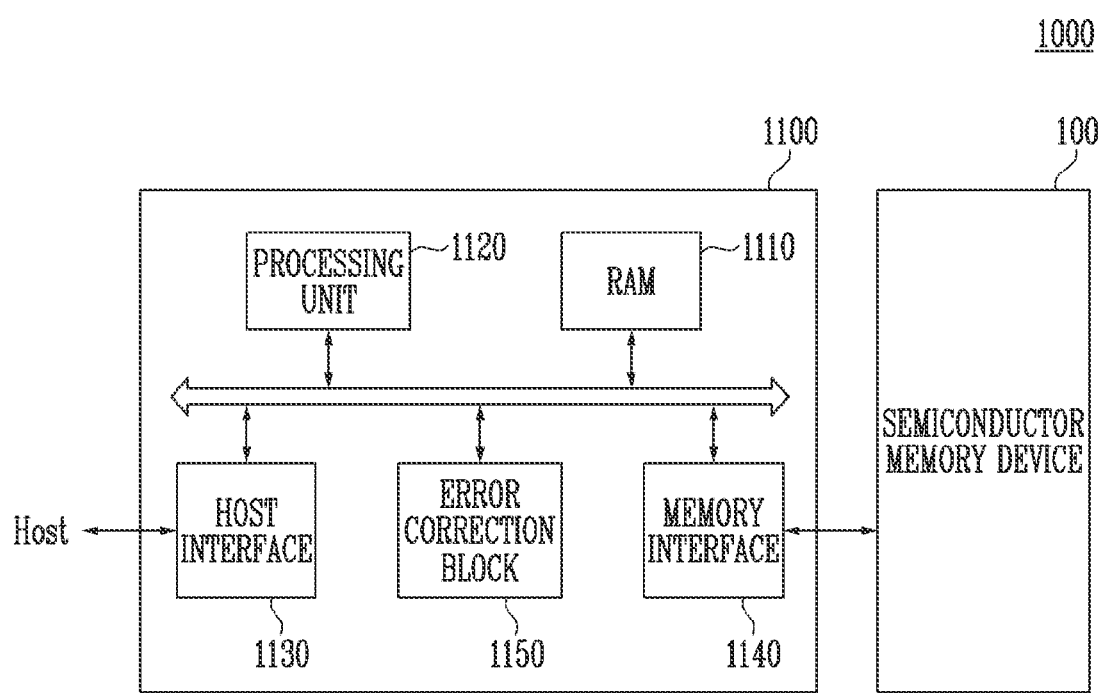
FIG. 22 is a block diagram illustrating a memory system including the semiconductor memory device of FIG.

FIG. 22 is a block diagram illustrating a memory system including the semiconductor memory device of FIG.

Referring to FIG. 22, the memory system 1000 may include the semiconductor memory device 100 and a controller 1100. The semiconductor memory device 100 may be the semiconductor memory device described with reference to FIG. 1. Hereinafter, a repetitive description is omitted.

The controller 1100 may be connected to a host Host and the semiconductor memory device 100. The controller 1100 may be configured to access the semiconductor memory device 100 in response to a request from the host Host. For example, the controller 1100 may be configured to control read, write, erase, and background operations of the semiconductor memory device 100. The controller 1100 may be configured to provide an interface between the semiconductor memory device 100 and the host Host. The controller 1100 may be configured to drive firmware for controlling the semiconductor memory device 100.

The controller 1100 may include a random access memory (RAM) 1110, a processing unit 1120, a host interface 1130, a memory interface 1140, and an error correction block 1150. The RAM 1110 may be used as at least one of an operation memory of the processing unit 1120, a cache memory between the semiconductor memory device 100 and the host Host, and a buffer memory between the semiconductor memory device 100 and the host Host. The processing unit 1120 controls an overall operation of the controller 1100. In addition, the controller 1100 may temporarily store program data provided from the host Host during the write operation.

The host interface 1130 may include a protocol for performing data exchange between the host Host and the controller 1100. As an exemplary embodiment, the controller 1100 may be configured to communicate with the host Host through at least one of various interface protocols such as a universal serial bus (USB) protocol, a multimedia card (MMC) protocol, a peripheral component interconnection (PCI) protocol, a PCI-express (PCI-E) protocol, an advanced technology attachment (ATA) protocol, a serial ATA protocol, a parallel ATA protocol, a small computer system interface (SCSI) protocol, an enhanced small disk interface (ESDI) protocol, an integrated drive electronics (IDE) protocol, and a private protocol.

The memory interface 1140 interfaces with the semiconductor memory device 100. For example, the memory interface 1140 may include a NAND interface or a NOR interface.

The error correction block 1150 may be configured to detect and correct an error of data received from the semiconductor memory device 100 using an error correcting code (ECC). The processing unit 1120 may control the semiconductor memory device 100 to adjust the read voltage according to an error detection result of the error correction block 1150 and perform re-reading. As an exemplary embodiment, the error correction block may be provided as a component of the controller 1100.

The controller 1100 and the semiconductor memory device 100 may be integrated into one semiconductor device. As an exemplary embodiment, the controller 1100 and the semiconductor memory device 100 may be integrated into one semiconductor device to form a memory card. For example, the controller 1100 and the semiconductor memory device 100 may be integrated into one semiconductor device to form a memory card such as a PC card (personal computer memory card international association (PCMCIA)), a compact flash card (CF), a smart media card (SM or SMC), a memory stick, a multimedia card (MMC, RS-MMC, or MMCmicro), an SD card (SD, miniSD, microSD, or SDHC), and a universal flash storage (UFS).

The controller 1100 and the semiconductor memory device 100 may be integrated into one semiconductor device to form a semiconductor drive (solid state drive (SSD)). The semiconductor drive (SSD) may include a storage device configured to store data in a semiconductor memory. When the memory system 1000 may be used as the semiconductor drive (SSD), an operation speed of the host connected to the memory system 1000 is dramatically improved.

As another example, the memory system 1000 may be provided as one of various components of an electronic device such as a computer, an ultra-mobile PC (UMPC), a workstation, a net-book, a personal digital assistants (PDA), a portable computer, a web tablet, a wireless phone, a mobile phone, a smart phone, an e-book, a portable multimedia player (PMP), a portable game machine, a navigation device, a black box, a digital camera, a 3-dimensional television, a digital audio recorder, a digital audio player, a digital picture recorder, a digital picture player, a digital video recorder, and a digital video player, a device capable of transmitting and receiving information in a wireless environment, one of various electronic devices configuring a home network, one of various electronic devices configuring a computer network, one of various electronic devices configuring a telematics network, an RFID device, or one of various components configuring a computing system.

As an exemplary embodiment, the semiconductor memory device 100 or the memory system 1000 may be mounted as a package of various types. For example, the semiconductor memory device 100 or the memory system 1000 may be packaged and mounted in a method such as a package on package (PoP), ball grid arrays (BGAs), chip scale packages (CSPs), plastic leaded chip carriers (PLCC), a plastic dual in line package (PDIP), a die in waffle pack, die in wafer form, a chip on board (COB), a ceramic dual in line package (CERDIP), a plastic metric quad flat pack (MQFP), a thin quad flat pack (TQFP), a small outline integrated circuit (SOIC), a shrink small outline package (SSOP), a thin small outline package (TSOP), a system in package (SIP), a multi-chip package (MCP), a wafer-level fabricated package (WFP), or a wafer-level processed stack package (WSP).

Figure 23:
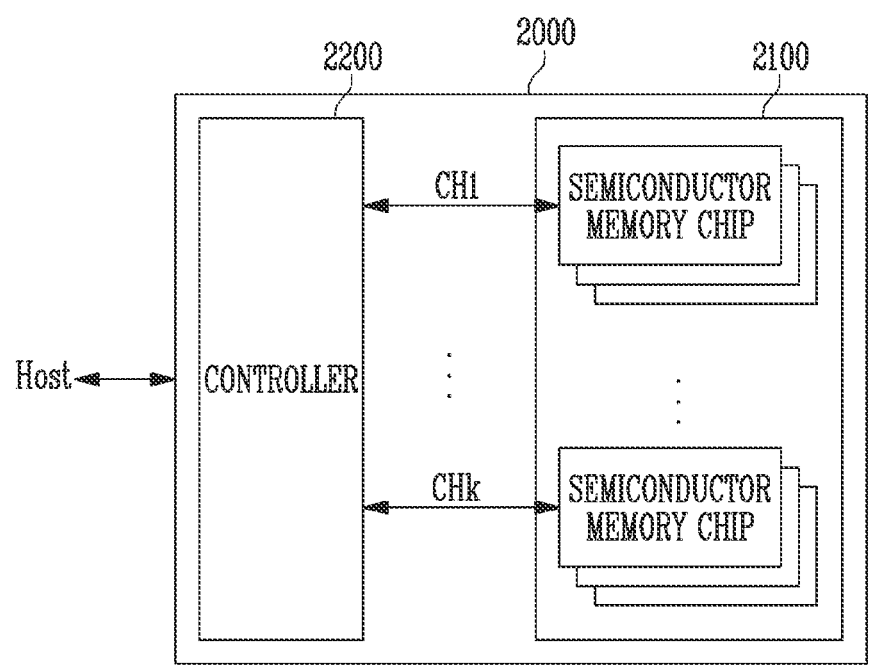
FIG. 23 is a block diagram illustrating an application example of the memory system of FIG. 22.

FIG. 23 is a block diagram illustrating an application example of the memory system of FIG. 22.

Referring to FIG. 23, the memory system 2000 may include a semiconductor memory device 2100 and a controller 2200. The semiconductor memory device 2100 may include a plurality of semiconductor memory chips. The plurality of semiconductor memory chips may be divided into a plurality of groups.

In FIG. 23, the plurality of groups communicate with the controller 2200 through first to k-th channels CH1 to CHk, respectively. Each semiconductor memory chip may be configured and may be operated similarly to that of any one of the semiconductor memory devices 100 described with reference to FIG.

Each group may be configured to communicate with the controller 2200 through one common channel. The controller 2200 may be configured similarly to the controller 1100 described with reference to FIG. 22 and may be configured to control the plurality of memory chips of the semiconductor memory device 2100 through the plurality of channels CH1 to CHk.

Figure 24:
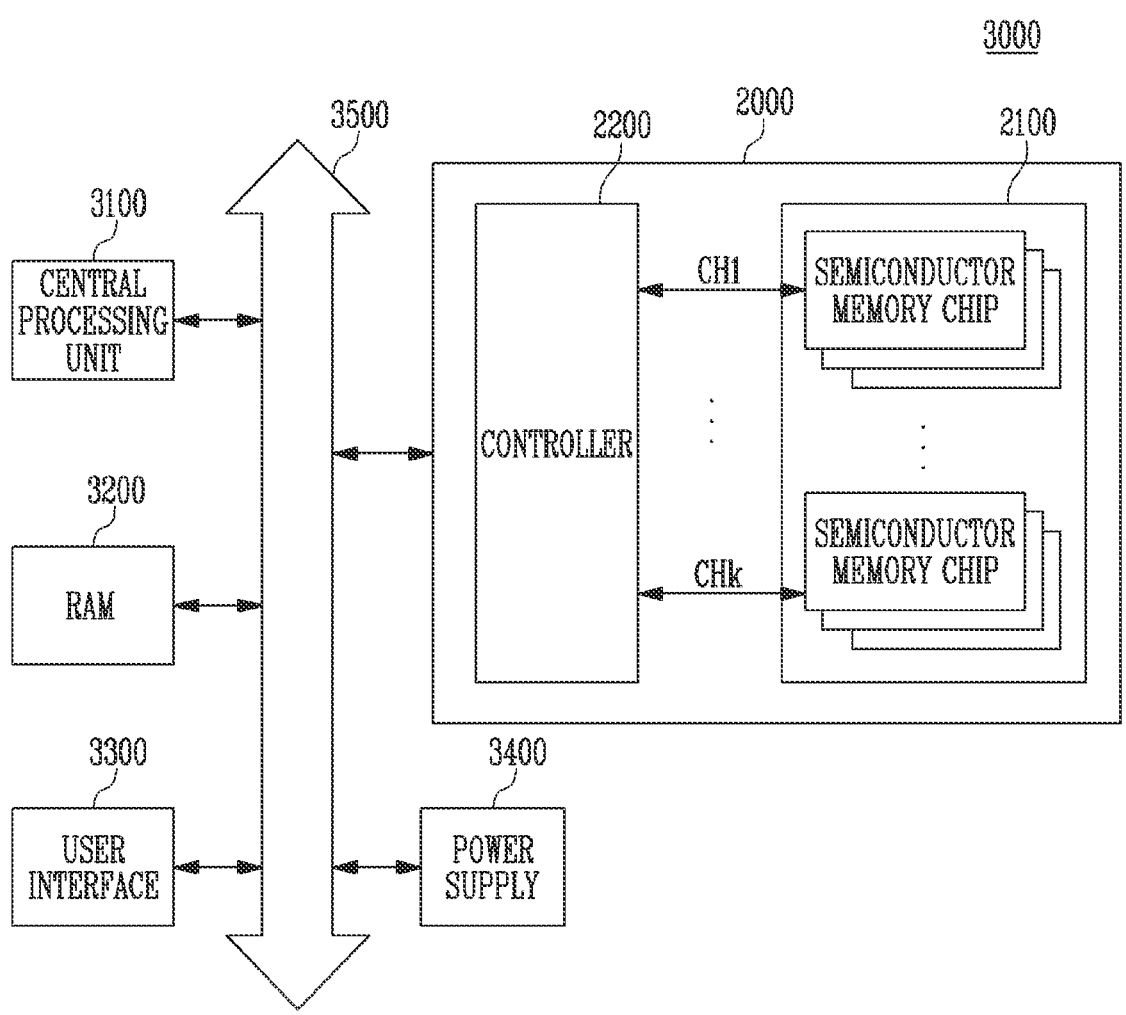
FIG. 24 is a block diagram illustrating a computing system including the memory system described with reference to FIG. 23.

FIG. 24 is a block diagram illustrating a computing system including the memory system described with reference to FIG. 23.

The computing system 3000 may include a central processing unit 3100, a random access memory (RAM) 3200, a user interface 3300, a power supply 3400, a system bus 3500, and the memory system 2000.

The memory system 2000 may be electrically connected to the central processing unit 3100, the RAM 3200, the user interface 3300, and the power supply 3400 through the system bus 3500. Data that is provided through the user interface 3300 or processed by the central processing unit 3100 may be stored in the memory system 2000.

In FIG. 24, the semiconductor memory device 2100 may be connected to the system bus 3500 through the controller 2200. However, the semiconductor memory device 2100 may be configured to be directly connected to the system bus 3500. At this time, a function of the controller 2200 may be performed by the central processing unit 3100 and the RAM 3200.

In FIG. 24, the memory system 2000 described with reference to FIG. 23 is provided. However, the memory system 2000 may be replaced with the memory system 1000 described with reference to FIG. 22. As an exemplary embodiment, the computing system 3000 may be configured to include both of the memory systems 1000 and 2000 described with reference to FIGS. 22 and 23.

What is claimed is:

1. A semiconductor memory device comprising:
a memory cell array including a plurality of memory cells;
a peripheral circuit configured to perform a program operation on selected memory cells among the plurality of memory cells; and
a control logic configured to control the program operation of the peripheral circuit,
wherein the program operation includes a plurality of program loops,
wherein the control logic is configured to control the peripheral circuit to apply a program voltage to a select word line that is connected to the selected memory cells, apply a first under drive voltage that is determined based on at least one verify voltage to the select word line, and apply the at least one verify voltage to the select word line in each of the plurality of program loops,
wherein the program voltage, the first under drive voltage and the at least one verify voltage are sequentially applied to the select word line, and
wherein the first under drive voltage is at a lower voltage level than the at least one verify voltage.

2. The semiconductor memory device of claim 1, wherein the control logic is configured to determine the first under drive voltage based on the number of program loops currently being performed.

3. The semiconductor memory device of claim 2, wherein the control logic is configured to determine the first under drive voltage based on the following equation:

$$\text{Vud}(i)=\text{Vvr}-k1*i\text{, and}$$

wherein i is a natural number indicating the number of current program loops, Vvr is the at least one verify voltage, k1 is a real number greater than 0, and Vud(i) is the first under drive voltage in a current program loop.

4. The semiconductor memory device of claim 1, wherein the control logic is configured to determine the first under drive voltage based on a difference between the program voltage and the at least one verify voltage.

5. The semiconductor memory device of claim 4, wherein the control logic is configured to determine the first under drive voltage based on the following equation:

$$Vvr-Vud(i)=k2*(Vpgm(i)-Vvr),\ \text{and}$$

wherein i is a natural number indicating the number of current program loops, Vvr is the at least one verify voltage, k2 is a real number greater than 0, Vud(i) is the first under drive voltage in a current program loop, and Vpgm(i) is the program voltage that is applied in the current program loop.

6. The semiconductor memory device of claim 1, wherein first, second and third verify voltages are used in at least one program loop of the plurality of program loops, the first verify voltage being at a lower voltage level than the second verify voltage, the second verify voltage being at a lower voltage level than the third verify voltage,
  wherein the control logic is configured to control the peripheral circuit to apply the program voltage to the select word line that is connected to the selected memory cells, configured to apply the first under drive voltage that is determined based on the third verify voltage, among the first, second and third verify voltages, to the select word line, and configured to apply the third verify voltage to the select word line, and
  wherein the first under drive voltage is at a lower voltage level than the third verify voltage.

7. The semiconductor memory device of claim 6, wherein, after applying the third verify voltage, the control logic is configured to control the peripheral circuit to apply a second under drive voltage that is determined based on the second verify voltage and the third verify voltage to the select word line and apply the second verify voltage to the select word line, and
  wherein the second under drive voltage is at a lower voltage level than the second verify voltage.

8. The semiconductor memory device of claim 7, wherein, after applying the second verify voltage, the control logic is configured to control the peripheral circuit to apply a third under drive voltage that is determined based on the first verify voltage and the second verify voltage to the select word line and apply the first verify voltage to the select word line, and
  wherein the third under drive voltage is at a lower voltage level than the first verify voltage.

9. The semiconductor memory device of claim 1, wherein first, second and third verify voltages are used in at least one program loop of the plurality of program loops, the first verify voltage being at a lower voltage level than the second verify voltage and the second verify voltage being at a lower voltage level than the third verify voltage,
  wherein the control logic is configured to control the peripheral circuit to apply the program voltage to the select word line that is connected to the selected memory cells, apply the first under drive voltage that is determined based on the first verify voltage, among the first, second and third verify voltages, to the select word line, and apply the first verify voltage to the select word line, and
  wherein the first under drive voltage is at a lower voltage level than the first verify voltage.

10. The semiconductor memory device of claim 9, wherein, after applying the first verify voltage, the control logic is configured to control the peripheral circuit to apply a first over drive voltage that is determined based on the first verify voltage and the second verify voltage to the select word line and apply the second verify voltage to the select word line, and
  wherein the first over drive voltage is at a higher voltage level than the second verify voltage.

11. The semiconductor memory device of claim 10, wherein, after applying the second verify voltage, the control logic is configured to control the peripheral circuit to apply a second over drive voltage that is determined based on the second verify voltage and the third verify voltage to the select word line and apply the third verify voltage to the select word line, and
  wherein the second over drive voltage is at a higher voltage level than the third verify voltage.

12. A method of operating a semiconductor memory device for programming selected memory cells among a plurality of memory cells that are included in a memory cell array, the method comprising a plurality of program loops, each of the plurality of program loops comprising:
  determining operation voltages to be used in a current program loop;
  applying a program voltage to the selected memory cells by using the determined operation voltages; and
  performing a verify operation on the selected memory cells,
  wherein the operation voltages include at least one verify voltage and a first under drive voltage that is at a lower voltage level than the verify voltage,
  wherein the first under drive voltage and the at least one verify voltage are sequentially applied to a select word line, and
  wherein, in determining the operation voltages to be used in the current program loop, the first under drive voltage is determined based on the verify voltage.

13. The method of claim 12, wherein determining the operation voltages to be used in the current program loop comprises:
  determining the program voltage to be used in the current program loop;
  determining the at least one verify voltage; and
  determining the first under drive voltage based on a difference between the program voltage and a verify voltage to be first applied, among the at least one verify voltage.

14. The method of claim 13, wherein, in determining the first under drive voltage based on the difference between the program voltage and the verify voltage to be first applied, among the at least one verify voltage, the first under drive voltage is determined so that a difference between the verify voltage to be first applied and the first under drive voltage increases as the difference between the program voltage and the verify voltage to be first applied increases.

15. The method of claim 12, wherein determining the operation voltages to be used in the current program loop comprises:
  determining the program voltage to be used in the current program loop;
  determining the at least one verify voltage; and
  determining the first under drive voltage based on the number of current program loops.

16. The method of claim 15, wherein, in determining the first under drive voltage based on the number of current program loops, the first under drive voltage is determined to be lower as the number of current program loops increases.

17. The method of claim 13, wherein a first verify voltage, a second verify voltage that is at a higher voltage level than the first verify voltage, and a third verify voltage that is at a higher voltage level than the second verify voltage are used in at least one program loop of the plurality of program loops, and wherein the determining the first under drive voltage based on the difference between the program voltage and the verify voltage to be first applied, among the at least one verify voltage, comprises determining the first under drive voltage based on a difference between the program voltage and the third verify voltage.

18. The method of claim 17, wherein determining the operation voltages to be used in the current program loop further comprises:

determining a second under drive voltage that is at a lower voltage level than the second verify voltage based on a difference between the second verify voltage and the third verify voltage; and determining a third under drive voltage that is at a lower voltage level than the first verify voltage based on a difference between the first verify voltage and the second verify voltage.

19. The method of claim 17, wherein performing the verify operation on the selected memory cells comprises:

applying the first under drive voltage to the select word line that is connected to the selected memory cells;

applying the third verify voltage to the select word line;

applying the second under drive voltage to the select word line;

applying the second verify voltage to the select word line;

applying the third under drive voltage to the select word line; and applying the first verify voltage to the select word line.

20. The method of claim 13, wherein a first verify voltage, a second verify voltage that is at a higher voltage level than the first verify voltage, and a third verify voltage that is at a higher voltage level than the second verify voltage are used in at least one program loop of the plurality of program loops, and wherein determining the first under drive voltage based on the difference between the program voltage and the verify voltage to be first applied, among the at least one verify voltage, comprises determining the first under drive voltage based on a difference between the program voltage and the first verify voltage.

21. The method of claim 17, wherein determining the operation voltages to be used in the current program loop further comprises:

determining a first over drive voltage that is at a higher voltage level than the second verify voltage based on a difference between the first verify voltage and the second verify voltage; and determining a second over drive voltage that is at a higher voltage level than the third verify voltage based on a difference between the second verify voltage and the third verify voltage.

22. The method of claim 21, wherein performing the verify operation on the selected memory cells comprises:

applying the first under drive voltage to the select word line that is connected to the selected memory cells;

applying the first verify voltage to the select word line;

applying the first over drive voltage to the select word line;

applying the second verify voltage to the select word line;

applying the second over drive voltage to the select word line; and applying the third verify voltage to the select word line.

* * * * *